United States Patent
Chauvette

(10) Patent No.: US 11,849,638 B2
(45) Date of Patent: Dec. 19, 2023

(54) MECHANICAL INTEGRATION OF BUTTONS FOR PIEZO-ELECTRIC ACTUATORS

(71) Applicant: Boréas Technologies Inc., Bromont (CA)

(72) Inventor: Guillaume Chauvette, Bromont (CA)

(73) Assignee: Boréas Technologies Inc., Bromont (CA)

(*) Notice: Subject to any disclaimer, the term of this patent is extended or adjusted under 35 U.S.C. 154(b) by 0 days.

(21) Appl. No.: 18/047,020

(22) Filed: Oct. 17, 2022

(65) Prior Publication Data

US 2023/0062569 A1 Mar. 2, 2023

Related U.S. Application Data

(63) Continuation of application No. 17/186,564, filed on Feb. 26, 2021, now Pat. No. 11,502,238.

(60) Provisional application No. 62/986,175, filed on Mar. 6, 2020.

(51) Int. Cl.
| | |
|---|---|
| *H05K 5/00* | (2006.01) |
| *H10N 30/20* | (2023.01) |
| *H05K 7/14* | (2006.01) |
| *H05K 5/02* | (2006.01) |
| *H10N 30/30* | (2023.01) |

(52) U.S. Cl.
CPC .......... *H10N 30/20* (2023.02); *H05K 5/0017* (2013.01); *H05K 5/0217* (2013.01); *H05K 7/1427* (2013.01); *H10N 30/30* (2023.02)

(58) Field of Classification Search
CPC ... H05K 5/0017; H05K 5/0217; H05K 7/1427
USPC ................. 361/728, 752, 796, 800
See application file for complete search history.

(56) References Cited

U.S. PATENT DOCUMENTS

| | | |
|---|---|---|
| 2010/0039299 A1 | 2/2010 | Yang et al. |
| 2011/0228493 A1 | 9/2011 | Liang et al. |
| 2014/0302705 A1 | 10/2014 | Park et al. |

(Continued)

FOREIGN PATENT DOCUMENTS

CN 108471687 * 2/2017 ............... H05K 5/06

OTHER PUBLICATIONS

International Search Report issued in respect of PCT International Patent Application No. PCT/CA2021/050246, dated May 18, 2021.

*Primary Examiner* — Hung S. Bui
(74) *Attorney, Agent, or Firm* — Stratford Group Ltd.

(57) ABSTRACT

A piezo-electric actuator on the side of a mobile device will enable pressure exerted by the user to be sensed at the conventional button locations, while providing a haptic feedback. Unfortunately, mechanical integration of piezo-electric actuators at the side of a mobile device is challenging. A mobile device in accordance with the present disclosure comprises a PCB; an outer frame surrounding the PCB; and a switch. The switch comprises: a first piezo-electric actuator configured to generate a first actuator voltage signal in response to a first force applied by a user, and to generate a first haptic feedback to the user in response to a first haptic voltage signal transmitted from the controller thereto; and a first virtual button in the outer frame configured to transmit the first force to the first piezo-electric actuator, and to transmit the first haptic feedback to the user.

20 Claims, 31 Drawing Sheets

(56) References Cited

U.S. PATENT DOCUMENTS

| | | |
|---|---|---|
| 2017/0076878 A1* | 3/2017 | Wang .................... H01H 13/14 |
| 2019/0107899 A1 | 4/2019 | Lu |
| 2019/0141818 A1* | 5/2019 | Pearson .................. H01Q 7/00 |
| 2019/0204929 A1 | 7/2019 | Attari et al. |

* cited by examiner

MECHANICAL INTEGRATION OF BUTTONS FOR PIEZO-ELECTRIC ACTUATORS

CROSS-REFERENCE TO RELATED APPLICATIONS

This application is a divisional of and claims priority to U.S. patent application Ser. No. 17/186,564, filed Feb. 26, 2021, which claims the benefit of U.S. Provisional Patent Application No. 62/986,175 filed Mar. 6, 2020, all of which are incorporated herein by reference in their entireties.

TECHNICAL FIELD

The present disclosure relates to the replacement of conventional electronic buttons with piezo-electric actuators, and in particular to the mechanical integration of buttons for piezo-electric actuators in mobile devices.

BACKGROUND

Using a piezo-electric actuator on the side of a mobile device not only enables the device's control system to sense the pressure exerted by the user at the location where buttons were traditionally positioned, but also provides a haptic feedback to the user that the "button" was "pressed". However, mechanical integration of piezo-electric actuator technology may come with a fair amount of challenges.

An object of the present disclosure is to replace physical buttons on mobile devices, e.g. smartphones and tablets, with piezo-electric actuators controlled by integrated circuits.

SUMMARY

Accordingly, a first apparatus includes a mobile device comprising: a PCB including a controller; an outer frame comprised of a hard-plastic and/or metallic material surrounding the PCB; a switch. The switch comprising: a first piezo-electric actuator configured to generate a first actuator voltage signal in response to a first force applied thereto by a user, and to generate a first haptic feedback to the user in response to a first haptic voltage signal transmitted from the controller thereto; and a first virtual button in the outer frame configured to transmit the first force from the user to the first piezo-electric actuator, and to transmit the first haptic feedback from the first piezo-electric actuator to the user.

BRIEF DESCRIPTION OF THE DRAWINGS

Some example embodiments will be described in greater detail with reference to the accompanying drawings, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1:
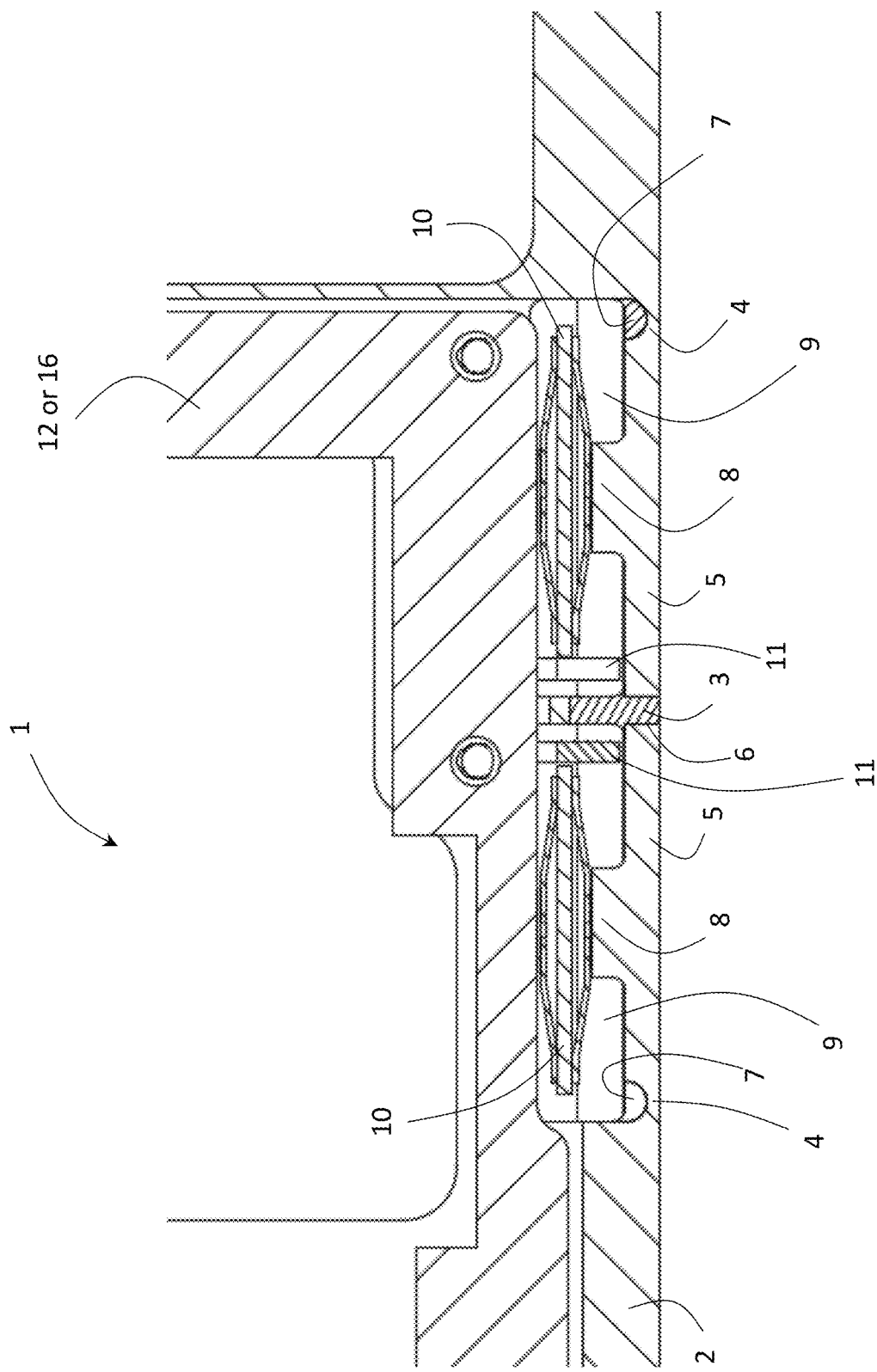
FIG. 1 is a partially sectioned top view in accordance with an example mechanical integration of a piezo-electric actuator in the side of a mobile device of the present disclosure.
Figure 2:
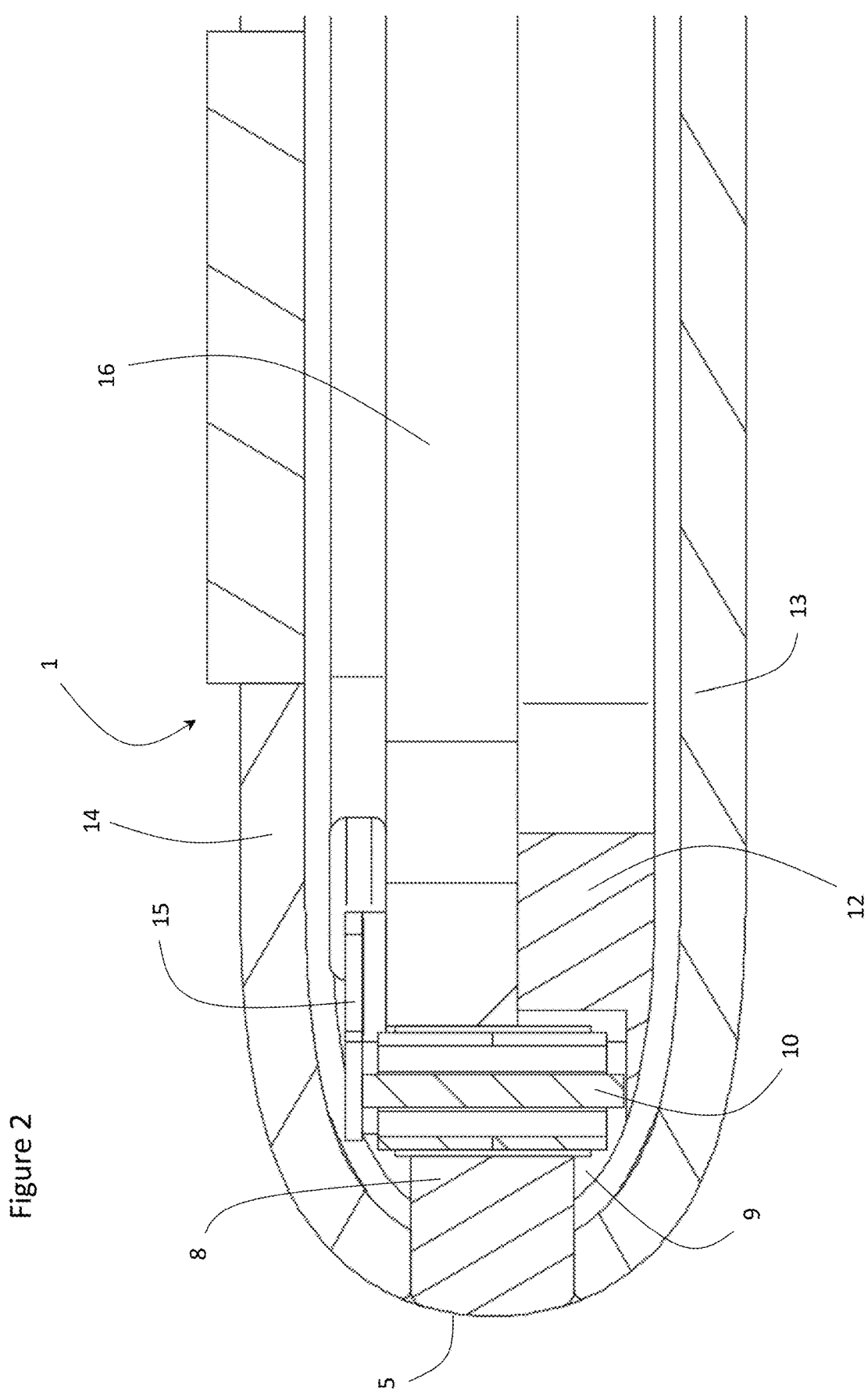
FIG. 2 is a partially sectioned side view of the device of FIG. 1.
Figure 3:
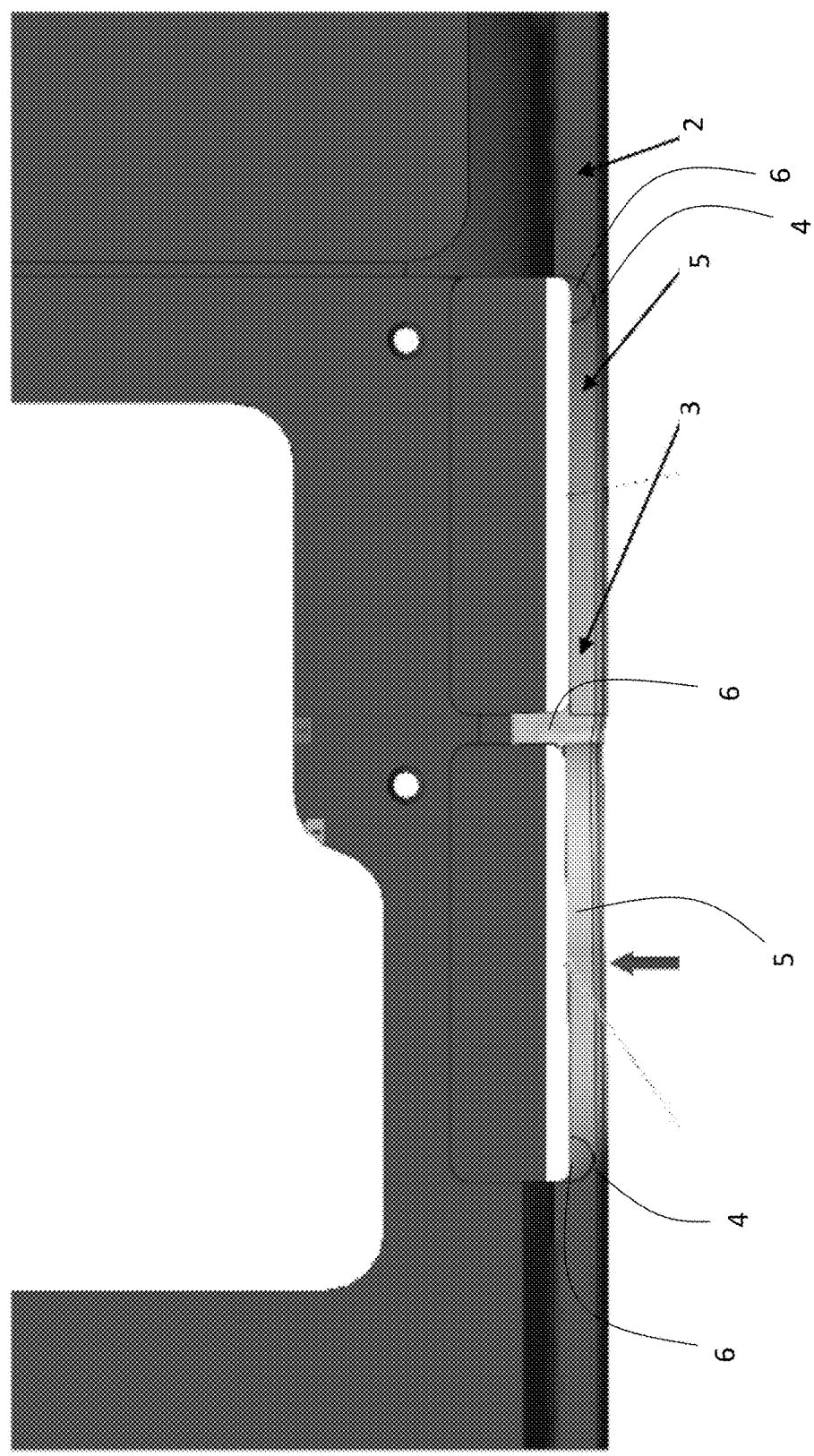
FIG. 3 is a top view of the device of FIG. 1.

With reference to FIGS. 1 to 3, a mobile device 1, e.g. a smart phone or tablet, includes an outer frame 2 with at least one opening 3 extending therethrough and at least one hinge 4, defining at least one virtual button 5 therein. Each hinge 4 may be formed by a thinned section of the outer frame 2 extending only partially through the outer frame 2, e.g. a living hinge. The opening 3 may extend through the entire thickness and height of the outer frame 2 forming a cantilevered structure, e.g. the virtual button 5. The opening 3 may be filled and sealed from external dirt and moisture, with a resilient member 6, e.g. an elastic material, such as an elastomer thermoplastic, to weaken the outer frame 2 of the mobile device 1, i.e. to locally lower the rigidity and form the virtual button 5, thereby enabling a small displacement of each of the virtual buttons 5 to activate one or more piezo-electric actuators 10 forming an electrical switch and/or other electronic control. A trough 7 formed in the inner wall of the outer frame 2 on one side of the virtual button 5 as a result of forming the thinned section of the hinge 4 may also be filled with the same material as the resilient member 6 or some other suitable elastic material. The resilient member 6 may be inserted in each of the openings 3 and in the trough 7 by various methods, such as pouring, over molding, etc., and may fill the opening 3 and in the trough 7 and adhere to the outer frame 2, in particular edges of the virtual buttons 5, enabling an ingress protection and lower rigidity.

Figure 4:
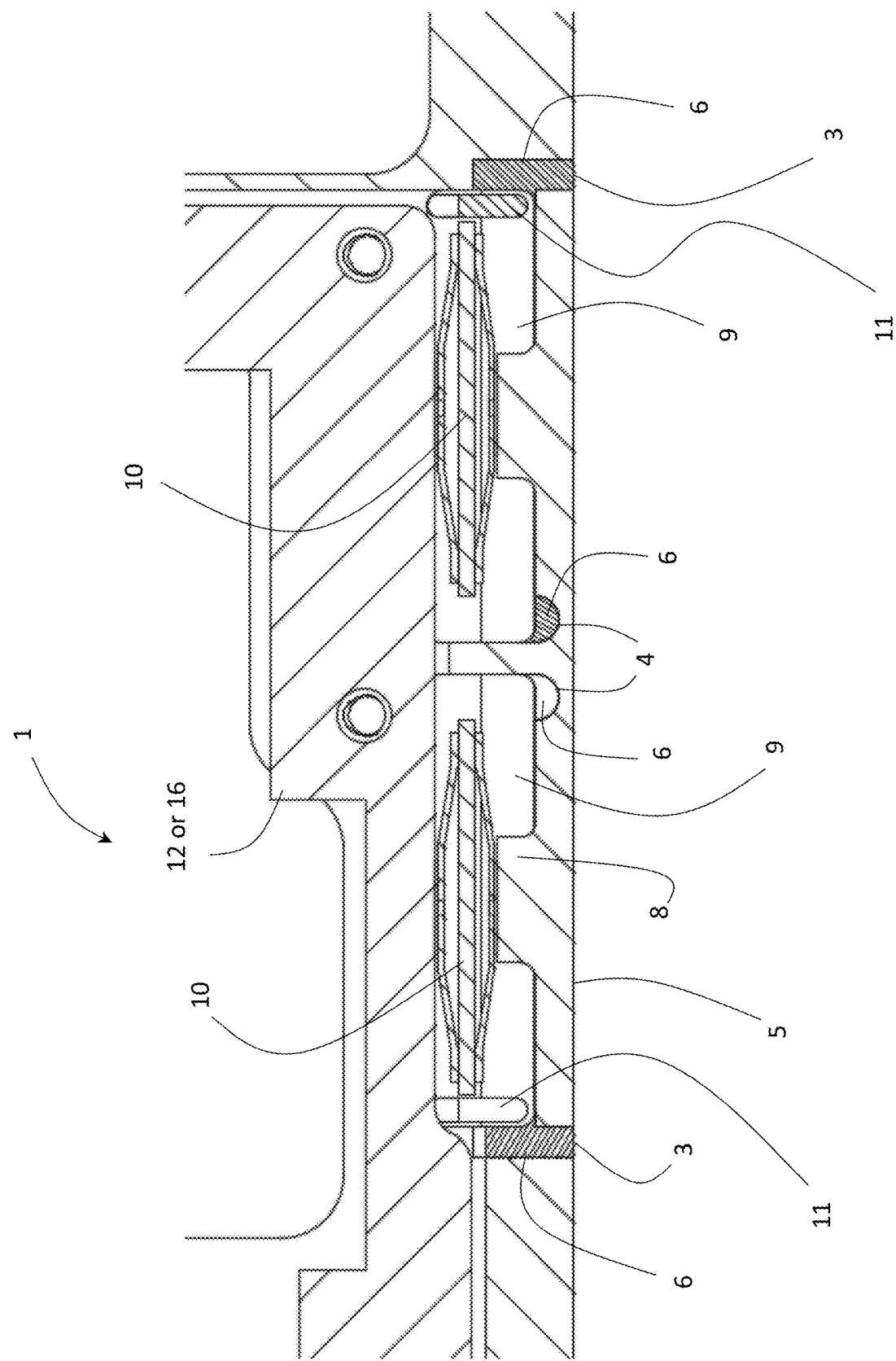
FIG. 4 is a partially sectioned top view in accordance with another example of a mechanical integration of a piezo-electric actuator in the side of a mobile device of the present disclosure.

The mobile device 1 may include two virtual buttons 5 each with one of the hinges 4, e.g. thinned sections, but sharing the same opening 3 and the same resilient member 6 attached at each outer end and extending therebetween. With particular reference to FIG. 4, the hinges 4, i.e. the thinned sections, may form a living hinge, whereas the resilient member 6 in the opening 3 may provide limited local deformation, e.g. approximately 0.02 mm-0.5 mm for 5 N force and a sidewall rigidity of 10 N/mm to 250 N/mm, but preferably 0.07 mm to 0.5 mm deflection for 10 N/mm to 70 N/mm rigidity, while maintaining a seal, e.g. hermetic or at least partially water proof with the outer frame 2. The thickness of the outer frame 2 thins from a normal thickness, e.g. of 3 mm-6 mm, to a reduced thickness at the virtual buttons 5, e.g. to 25% to 50% of the original thickness or to 0.5 mm to 2 mm, preferably 1 mm to 2 mm. Each trough 7 may include an even thinner thickness of ¼ to ½ of the rest of the virtual button 5 or ⅛ to 1/20 the original thickness, such as 0.25 mm to 0.75 mm, preferably 0.25 mm to 0.4 mm. There may be cavities 9 within the outer frame 2, similar to FIG. 21, to make room for the piezo-electric actuators 10, in that case, the outer frame 2 may have a local thickness of 2 mm-4 mm, from the exterior surface to cavity 9.

The outer frame 2 may also include one or more pedestals 8 extending from an outer wall of the outer frame 2, i.e. the virtual buttons 5, into one or more cavities 9 in the mobile device 1, e.g. a hollow section in the outer frame 2, between the outer frame 2 and an inner frame 12 or between the outer frame 2 and a PCB 16, which may be mounted on the inner frame 12 or the outer frame 2. Each pedestal 8 may then extend into contact with one side of one of the piezo-electric actuators 10 disposed in the cavity 9. The high rigidity of the outer frame 2 may be achieved once the virtual button 5 is sufficiently pressed to enter in contact with a hard stop 11, which extends from an inner structure, e.g. the inner frame 12, the PCB 16 or the outer frame 2, into the cavity 9 to within a small distance, i.e. proximate, to the virtual button 5 with a gap therebetween, thereby transferring the force to the inner frame 12, the PCB 16 or the outer frame 2 instead of the weakened sections of the outer frame 2, e.g. the opening 3 and the hinge 4. Accordingly, the virtual button 5 may only be pushed the distance of the gap, after which a first abutting surface on the virtual button 5 contacts a second abutting surface on the hard stop 11, thereby transferring any additional force to the inner frame 12, the outer frame 2 or the PCB 16 and preventing any further force from damaging the piezo-electric actuators 10. In FIG. 1, the hard stops 11 extend adjacent to the resilient member 6 in the opening 3, remote from the hinges 4, e.g. the thinned sections, which is the location of the greatest deflection of the buttons 5. A single opening 3 with the resilient member 6 may be shared by two adjacent buttons 5, while each button 5 includes one hinge 4, e.g. one thinned section or living hinge.

The piezo-electric actuator 10 may comprise a TDK PowerHap™ 1204H018V060 with a length of approximately 12 mm, and a width of approximately 4 mm, and a thickness of approximately 1.8 mm; however, any suitable piezo-electric actuator 10 may be used. The thickness of the outer frame 2 forming the virtual buttons 5, e.g. 0.3 mm to 1 mm, may have a sufficient area to bond to a top display 13 and a back cover 14 provided on the mobile device 1. The outer frame 2 may be formed in one piece, e.g. monolithic, with the back cover 14 or the outer frame 2 and the back cover 14 may be separate pieces. An additional slot may have to be cut along the side of the virtual button 5 to separate the virtual button 5 from the back cover 14, when the outer frame 2 and the back cover 14 comprise a single structure. The resilient members 6 and the resilient material in the troughs 7, may provide a continuous surface with the outer surface of the outer frame 2 to contact an adhesive/seal/gasket. Since the virtual buttons 5 may be very thin, especially at the hinge 4, there is little surface to apply adhesive to fix the top display 13 and the back cover 14; accordingly, the adhesive has the role to seal the outer frame 2 to the top display 13 and the back cover 14 from water and dust ingress.

A PCB flex connector 15 may be used to connect the piezo-electric actuator 10 to a controller of the mobile device 1 for exchanging an actuator voltage signal generated by the piezo-electric actuator 10, in response to a force applied to the virtual button 5, to the controller, and a haptic voltage signal to the piezo-electric actuator 10 to provide the haptic feedback to the user. The controller may be a separate chip mounted on and electrically connected to the PCB 16 or integrated in the PCB 16. The side of the mobile device 1, e.g. the outer surface of the outer frame 2 and the virtual buttons 5 may remain simple and continuous; however, color variation of the resilient members 6 are possible to clearly delineate the virtual buttons 5. With reference to FIG. 3, the resilient members 6 are the two thin bands on the left and right of the volume control virtual buttons 5. Accordingly, a force applied by the user to the side of the mobile device 1 to the virtual button 5 in the outer frame 2, i.e. perpendicular to the display 13 and the back cover 14, results in the transmission of the force from the user to the piezo-electric actuator 10, and in the transmission of the haptic feedback from the piezo-electric actuator 10 to the user.

Figure 5:
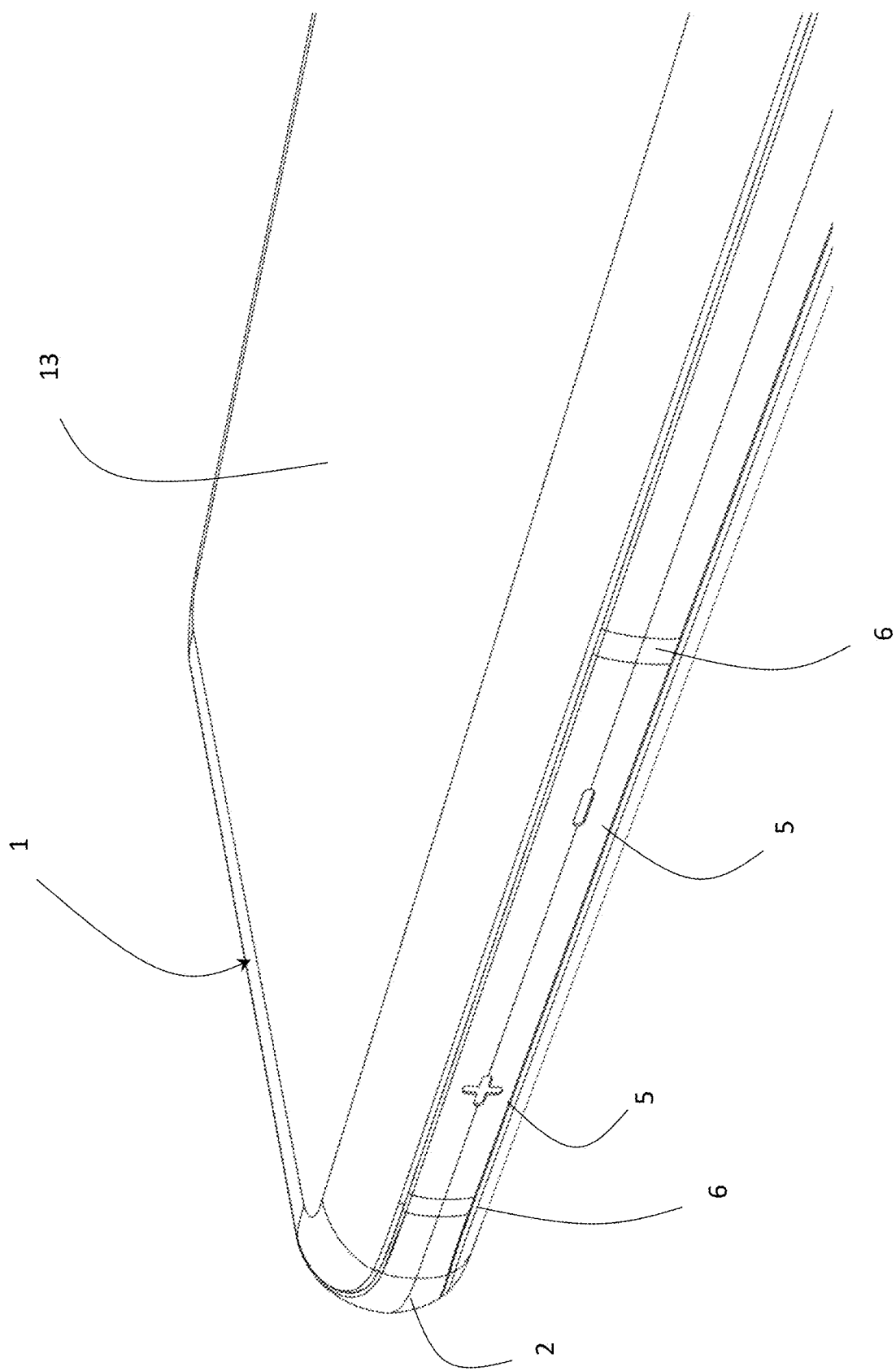
FIG. 5 is an isometric view of the device of FIG. 4.
Figure 6:
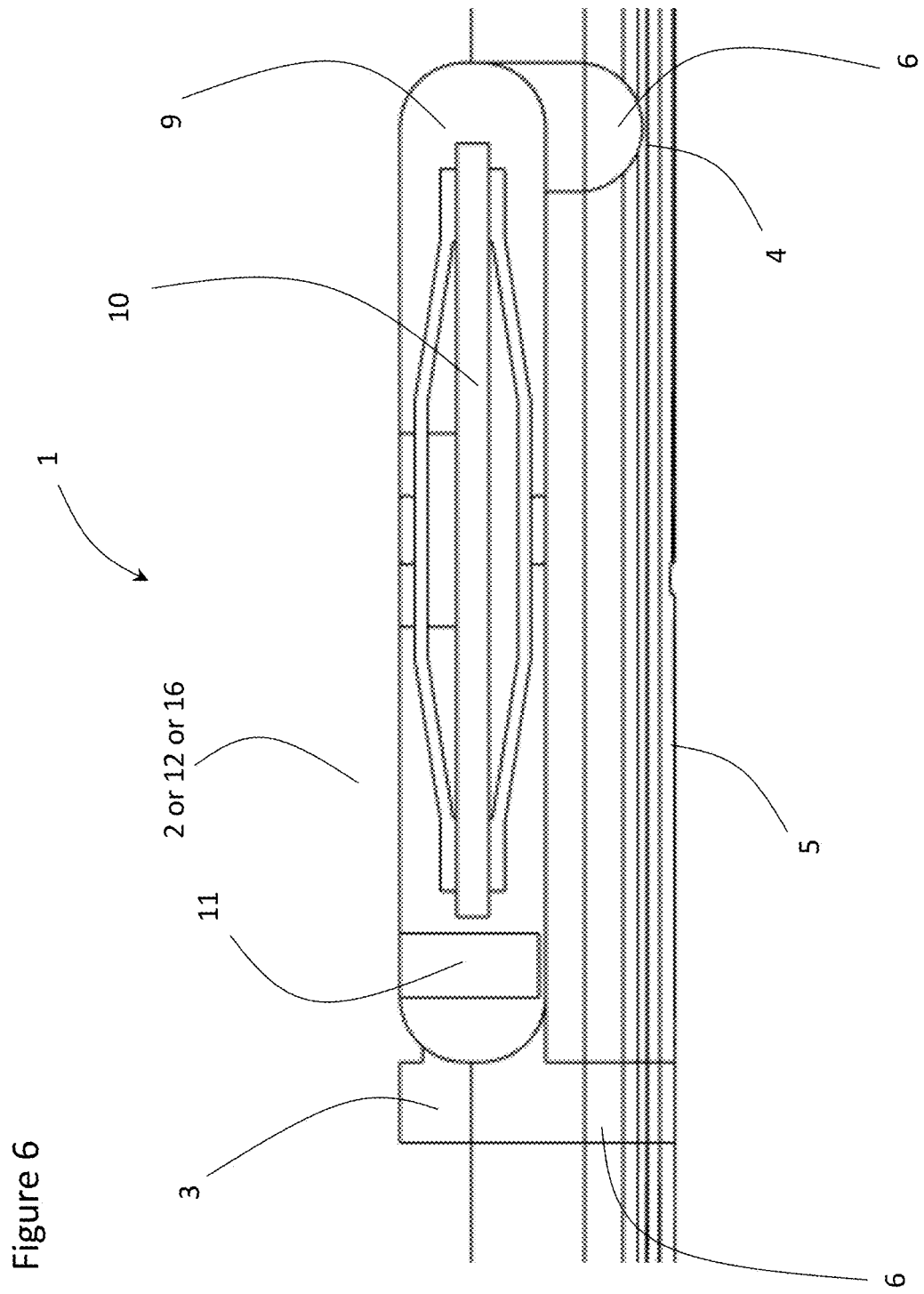
FIG. 6 is a partially sectioned top view in accordance with another example of a mechanical integration of a piezo-electric actuator in the side of a mobile device of the present disclosure.
Figure 7:
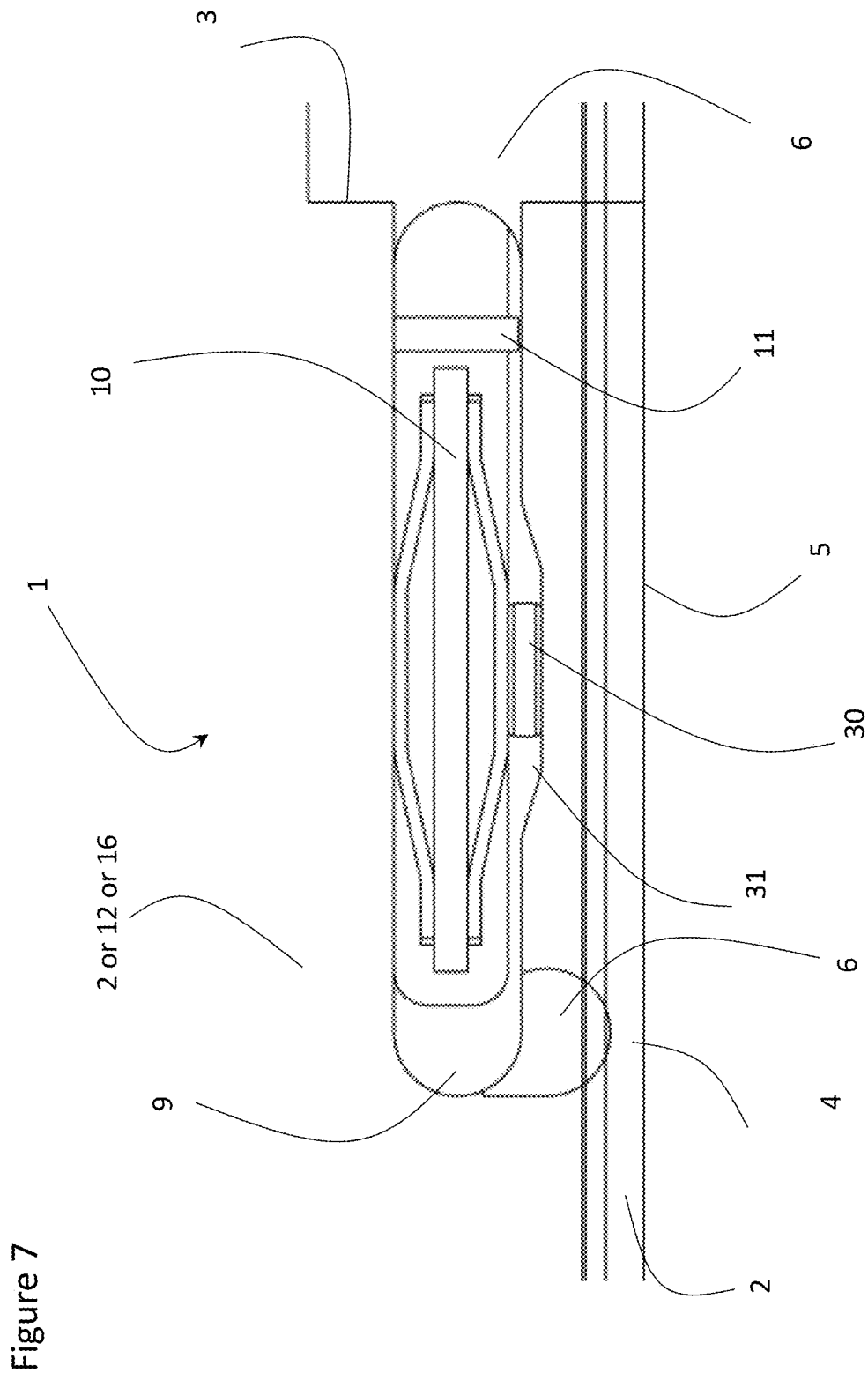
FIG. 7 is a partially sectioned top view in accordance with another example of a mechanical integration of a piezo-electric actuator in the side of a mobile device of the present disclosure.

In an alternate example, illustrated in FIGS. 5-7, each virtual button 5 may include their own opening 3, e.g. at an outer edge thereof, with the resilient member 6 therein, and their own hinge 4, e.g. thinned section forming a living hinge, with the elastic material therein. As above, the hard stops 11 extend into the cavity 9 on an opposite side to the hinge 4 proximate to the virtual buttons 5. The hard stops 11 may extend from an inner structure, such as the inner section of the outer frame 2, the inner frame 12 or from an edge of the PCB 16 adjacent to the resilient members 6 in the openings 3.

The virtual buttons 5 of FIG. 5 include a pedestal 8, whereas the virtual buttons 5 in FIG. 6 do not. However, with reference to FIG. 7, instead of or in addition to pedestals 8, a gap filler material 30 may be positioned between the virtual buttons 5 and the piezo-electric actuators 10 to ensure that the piezo-electric actuators 10 are located within the cavities 9 the correct distance from the inside wall of the virtual buttons 5. The gap filler material 20 may comprise an adhesive material or a combination of adhesive material and non-adhesive filler. A small channel 31 may be provided in the inside wall of the outer frame 2 to ensure enough space is provided for the gap filler material 30.

Figure 8:
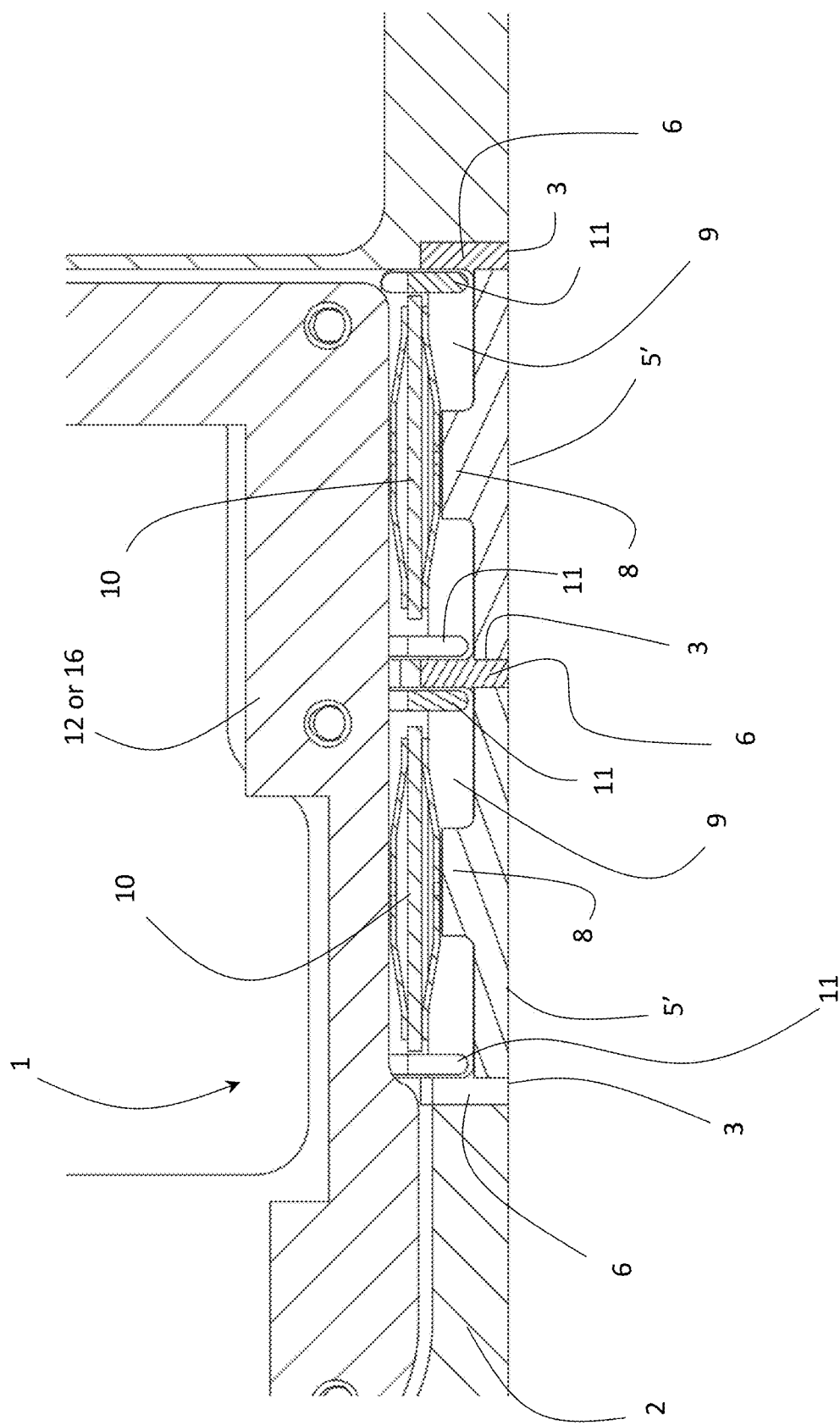
FIG. 8 is a partially sectioned top view in accordance with another example of a mechanical integration of a piezo-electric actuator in the side of a mobile device of the present disclosure.

In an alternate example of the mobile device 1, illustrated in FIG. 8, each virtual button 5' may include two openings 3, one at each side thereof with a resilient member 6 therein, whereby one or both of the resilient members 6 forms a hinge. Adjacent virtual buttons 5' may share a common opening 3 with the single resilient member 6. As above, the hard stops 11 extend from the outer frame 2 on an opposite side of the cavities 9, the internal frame 12 or the edge of the PCB 16 to proximate the virtual buttons 5', adjacent to all of the resilient members 6 in the openings 3. The virtual button 5' may include sections of the outer frame 2 removed when the openings 3 are formed, sections comprising the same material as the outer frame 2 for continuity, some other material configured to look like the outer frame 2, or some other material providing a contrast in color and style to the outer frame 2.

Figure 9:
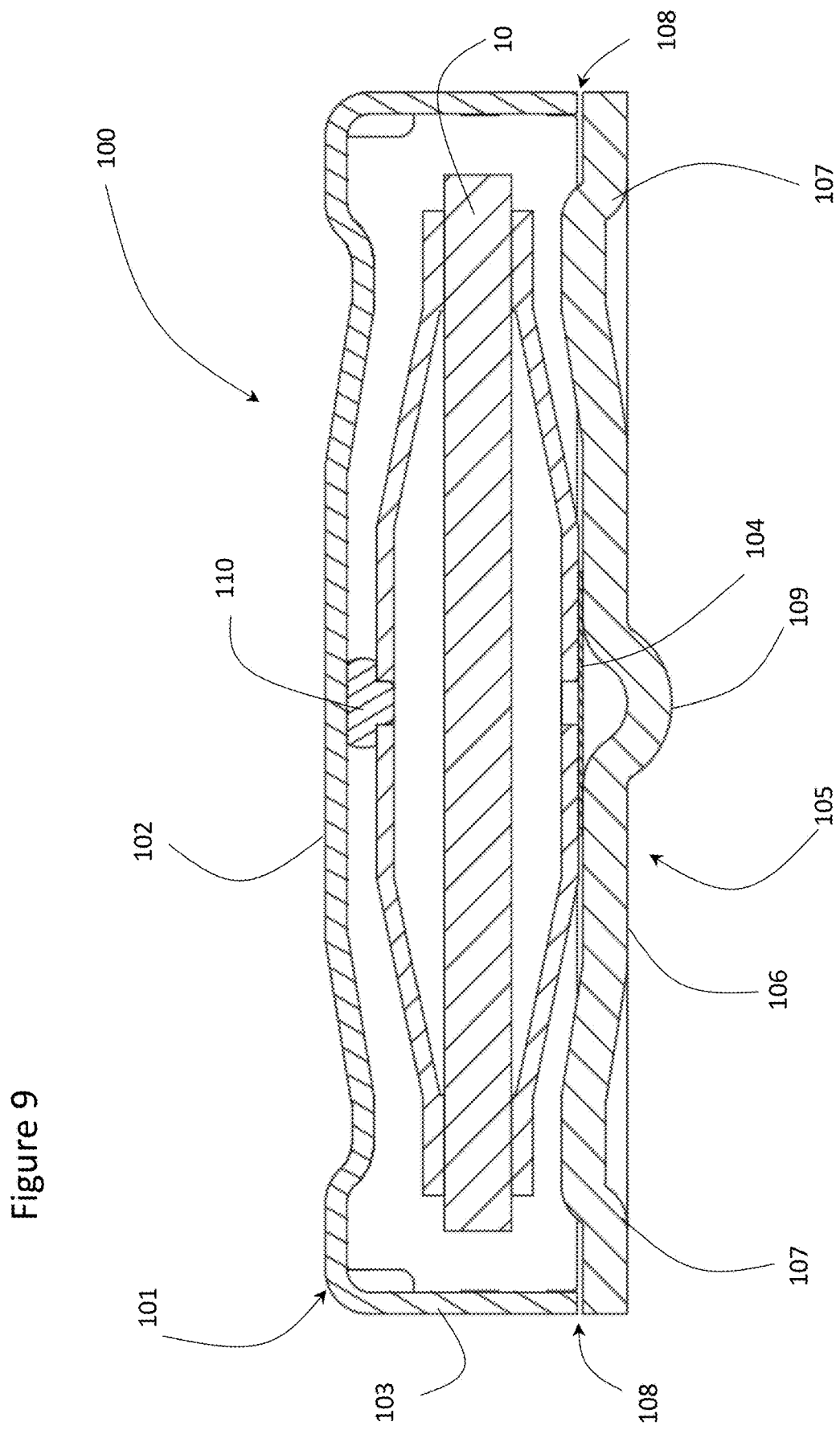
FIG. 9 is a partially sectioned top view in accordance with another example of a mechanical integration of a piezo-electric actuator in the side of a mobile device of the present disclosure.
Figure 10:
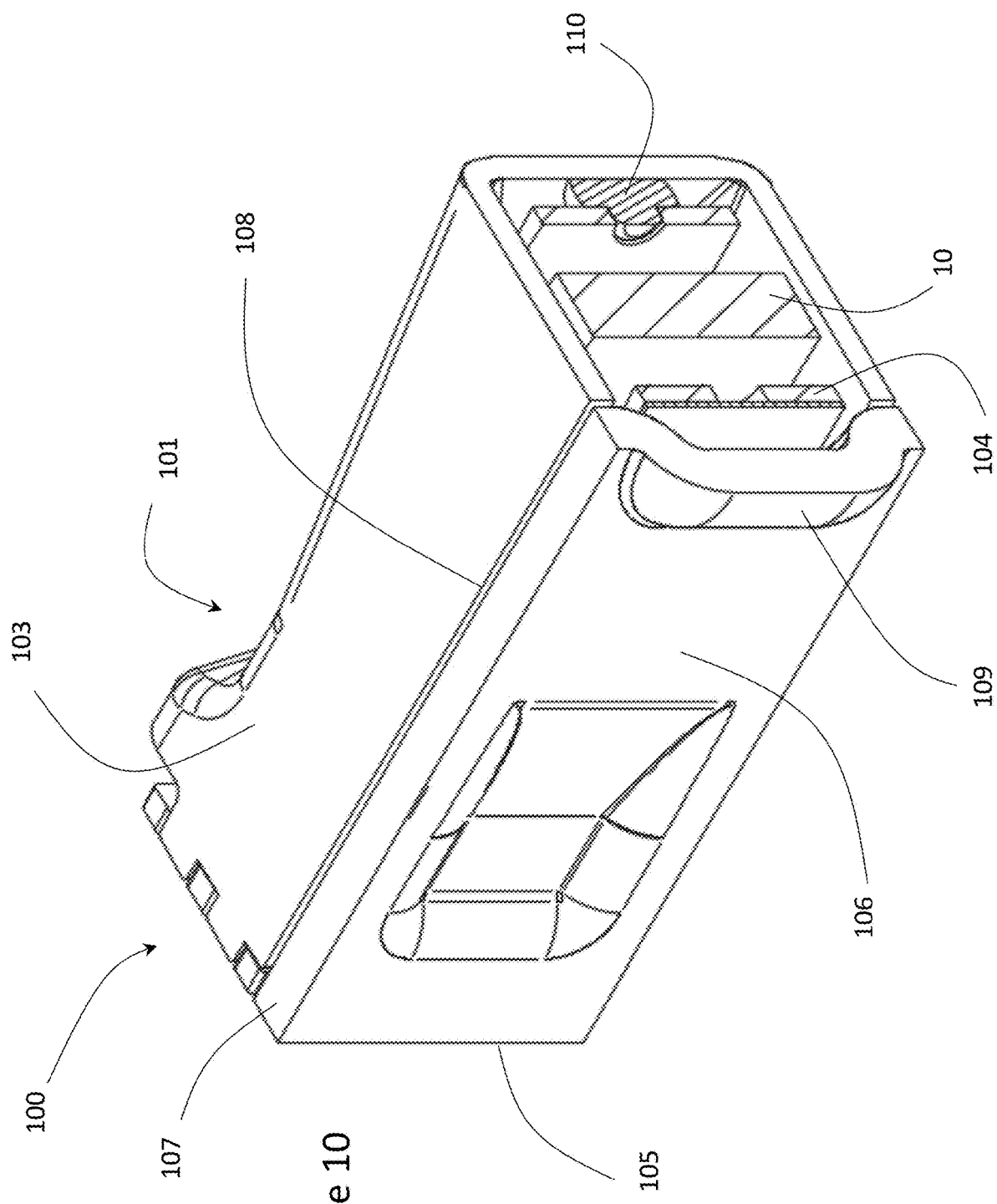
FIG. 10 is a partially sectioned isometric view of the device of FIG. 9.
Figure 11:
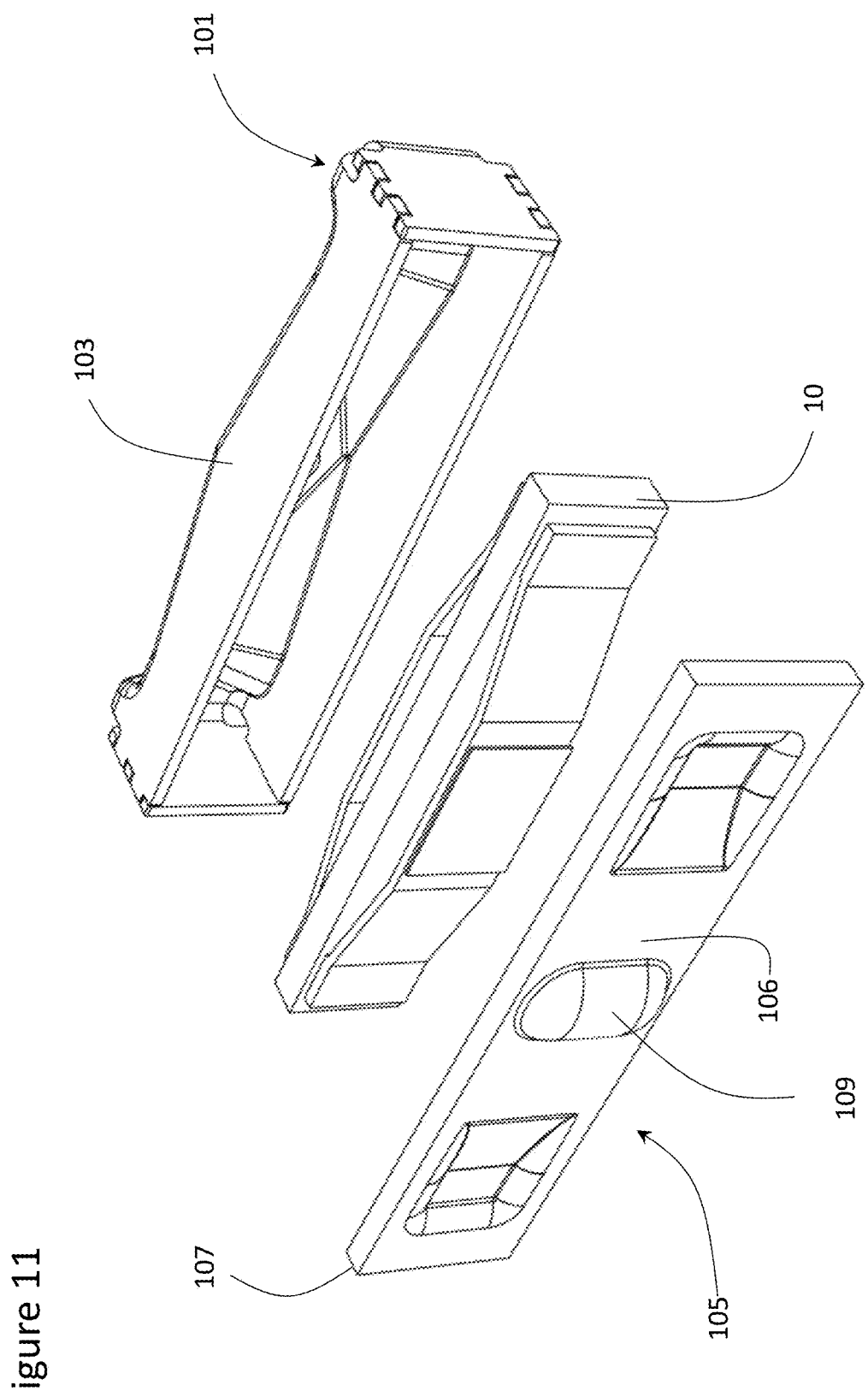
FIG. 11 is an exploded view of the device of FIG. 9.

With reference to FIGS. 9 to 11, in all of the aforementioned embodiments, the piezo-electric actuator 10 may be mounted within a protective housing 100 to ensure too large a force is not transmitted to the piezo-electric actuators 10, i.e. a force greater than what the piezo-electric actuators 10 can tolerate without substantial damage.

The housing 100 may comprise a main cover 101, including a base 102 and one or more vertical sections or walls 103 perpendicular to the base 102, e.g. four walls forming a rectangular body. The walls 103 may be configured to surround the piezo-electric actuator 1 forming an opening at one side providing access to a contact side of the piezo-electric actuator 10. The housing 100 may also include a pusher plate 105 covering the opening to the main cover 101, and including a central portion 106 in contact, e.g. connected with double sided tape 104, with the contact side of the piezo-electric actuator 10, and outer portions 107 at the edges of the pusher plate 105 space apart from outer free ends of the one or more walls 103 by a desired gap 108. Accordingly, the outer portions 107 form a first abutting surface, and the outer free ends of the one or more walls 103 form a second abutting surface providing a hard stop for the piezo-electric actuator 10 after the pusher plate 105 has been pushed as far as the gap 108, thereby protecting the piezo-electric actuator 10 from substantial damage from the application of excess force. The pusher plate 105 may also include a raised section or bump 109 extending outwardly from the central portion 106 for engaging one of the virtual buttons 5, as hereinbefore described. Accordingly, the virtual button 5 may only be pushed the distance of the gap, after which the first abutting surface contacts the second abutting surface, thereby transferring any additional force to housing and/or the inner frame 12 or PCB 16 and preventing any further force from damaging the piezo-electric actuators 10.

The housing 100 may also provide compensation for the wide variability in length of the piezo-electric actuators 10 by using moveable components or by filling gaps between the piezo-electric actuator 10 and the base 102 of the housing 100 with gap filling adhesive 110. By encapsulating the piezo-electric actuator 10 in a cartridge, i.e. the housing 100, the length of the housing 100 may be precisely controlled and a hard stop may be integrated independent of the frame of the mobile device 1. This would simplify the manufacturing process of the smart device 1 by eliminating two of the challenges in the design and integration of the piezo-electric actuator 10.

Figure 12:
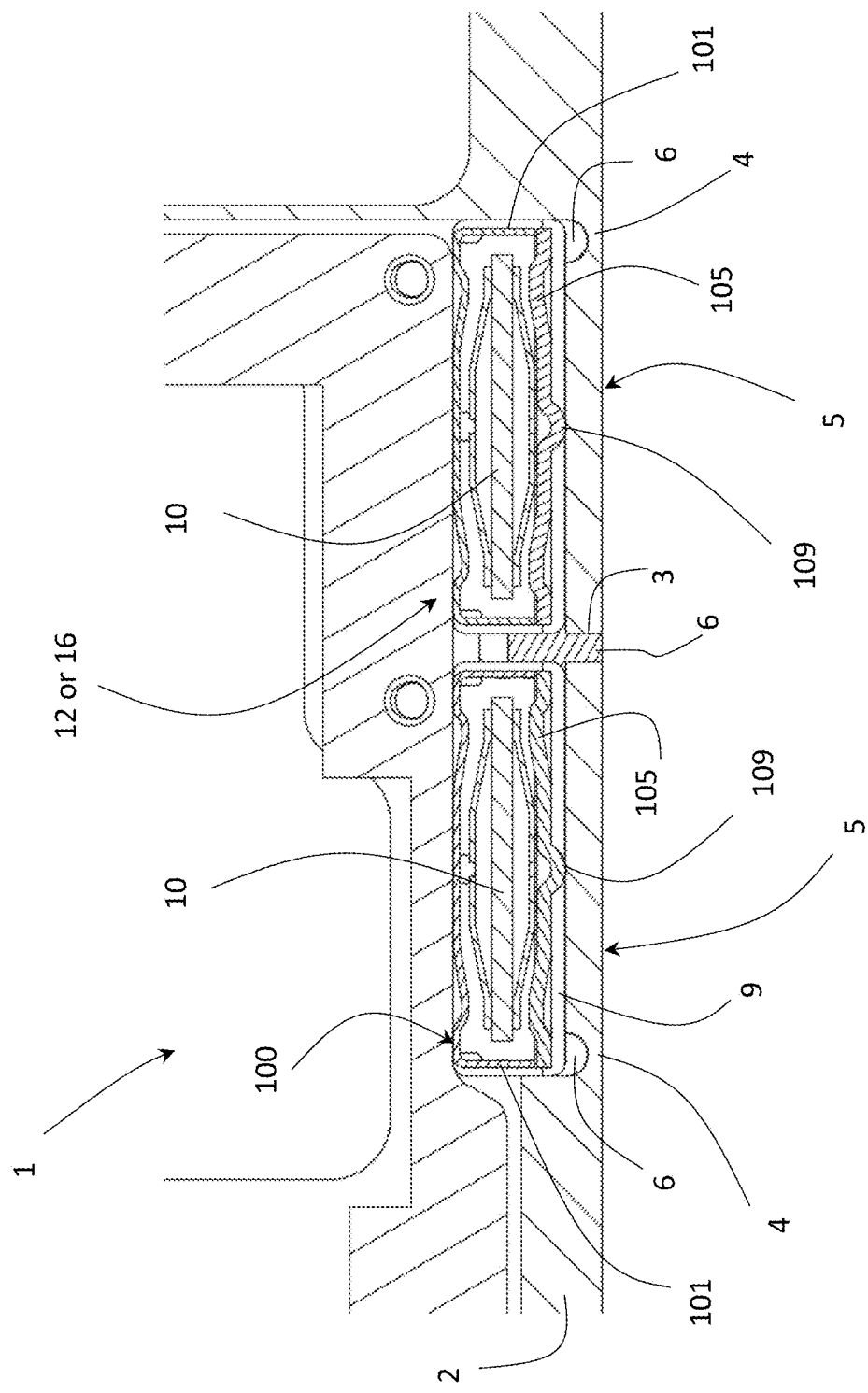
FIG. 12 is a partially sectioned top view in accordance with another example of a mechanical integration of a piezo-electric actuator in the side of a mobile device of the present disclosure.
Figure 13:
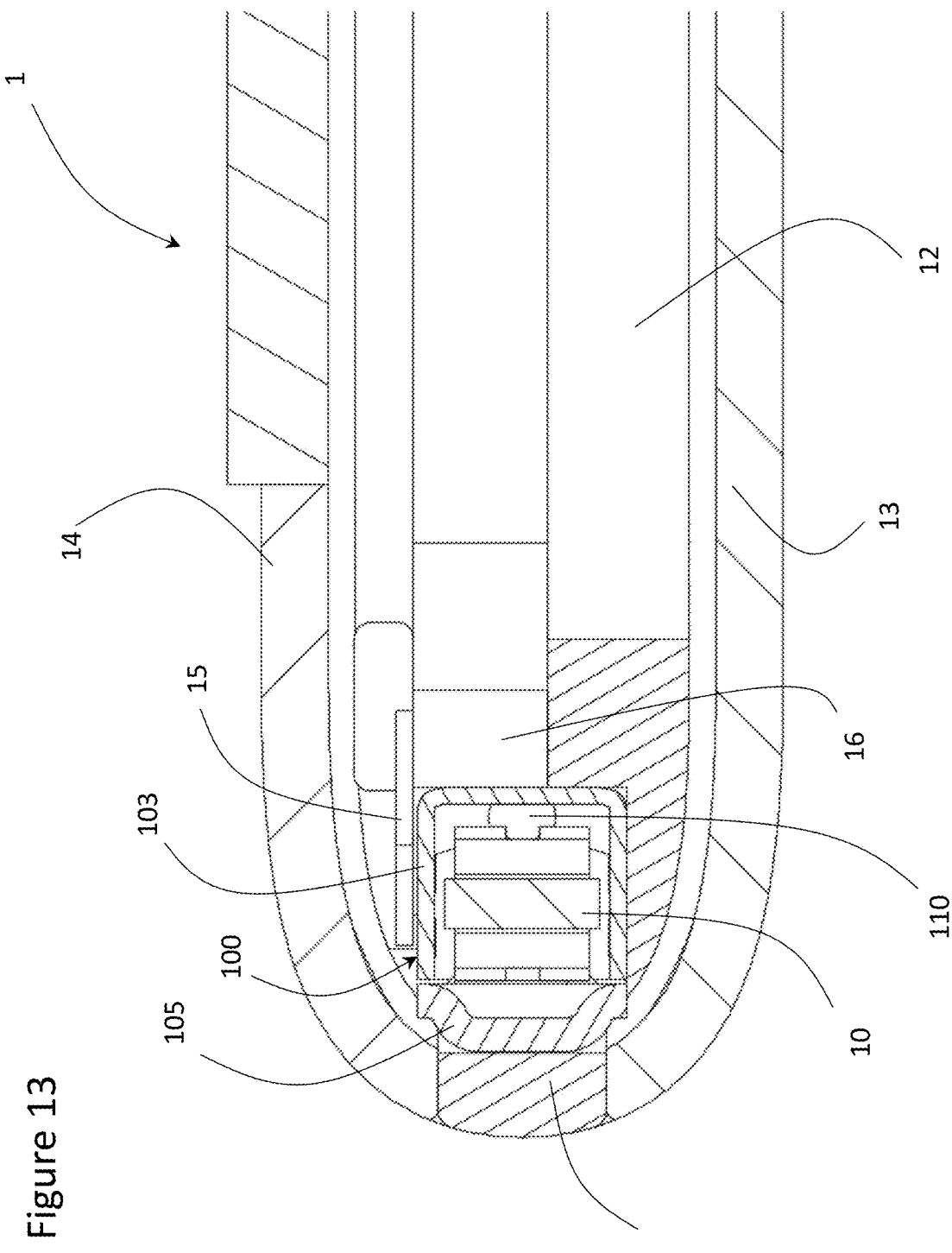
FIG. 13 is a partially section side view of the device of FIG. 12.

With reference to FIGS. 12 and 13, a pair of encapsulated piezo-electric actuators 10 are disposed in a smart device, similar to mobile device 1 of FIGS. 1-4, including the outer frame 2 and the virtual buttons 5, which include the shared opening 3 with the resilient member 6 therein, and the living hinges 4 on opposite sides thereof formed by the thinned areas 4 with the trough 7, which may also be filled with elastic material. The piezo-electric actuators 10 are encapsulated in the housing 100, and are positioned between the inner frame 12 or the PCB 16 and the outer frame 2 in the cavity 9. The virtual buttons 5 may include the pedestals 8 for contacting the pusher plate 105, and in particular the bump 109, but are not necessary, depending on the application, e.g. when there is no available space.

Figure 14:
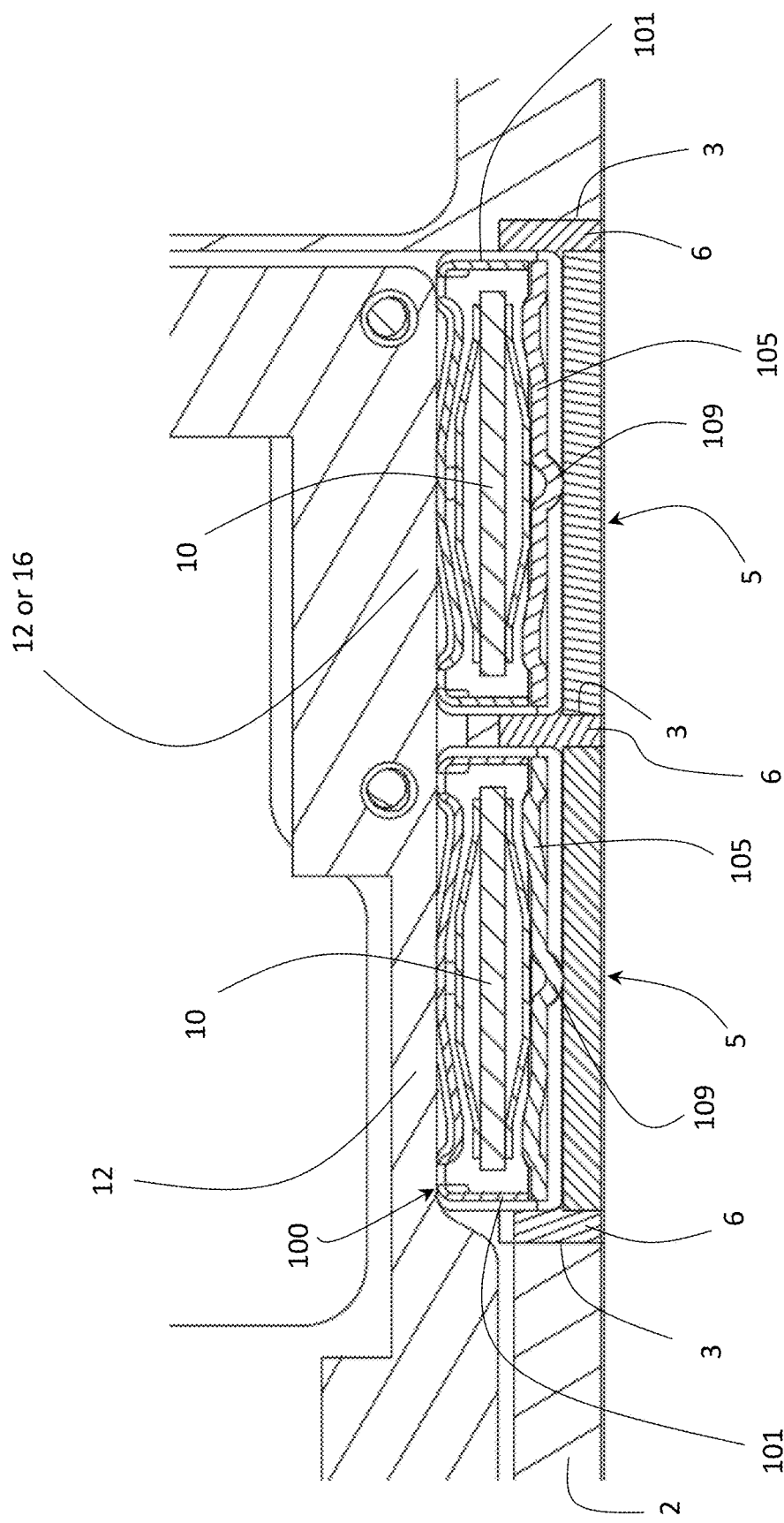
FIG. 14 is a partially sectioned top view in accordance with another example of a mechanical integration of a piezo-electric actuator in the side of a mobile device of the present disclosure.

With reference to FIG. 14, a pair of encapsulated piezo-electric actuators 10 are disposed in a smart device, similar to mobile device 1 of FIG. 8, including the outer frame 2 and the virtual buttons 5, which include the shared opening 3 with the resilient member 6, and the additional openings 3 on opposite sides of each button 5, both filled with one of the resilient members 6. One or both of the resilient members 6 forming a hinge. The piezo-electric actuators 10 are encapsulated in the housing 100, and are positioned between the inner frame 12 or the PCB 16 and the outer frame 2 in the cavity 9. The virtual buttons 5 may include the pedestals 8 for contacting the pusher plate 105, and in particular the bump 109, but are not necessary, depending on the application, e.g. when there is no available space.

Figure 15:
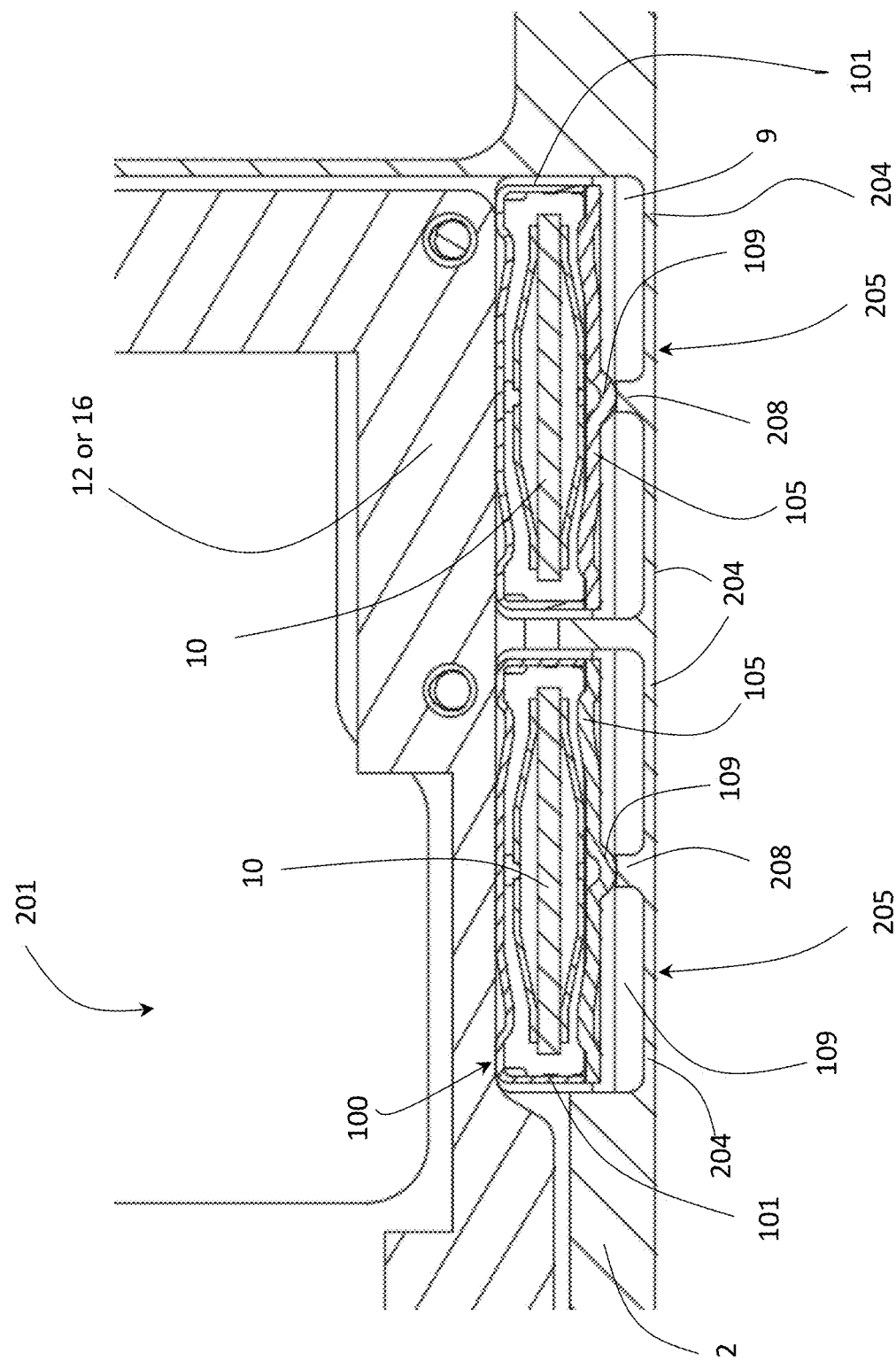
FIG. 15 is a partially sectioned top view in accordance with another example of a mechanical integration of a piezo-electric actuator in the side of a mobile device of the present disclosure.
Figure 16:
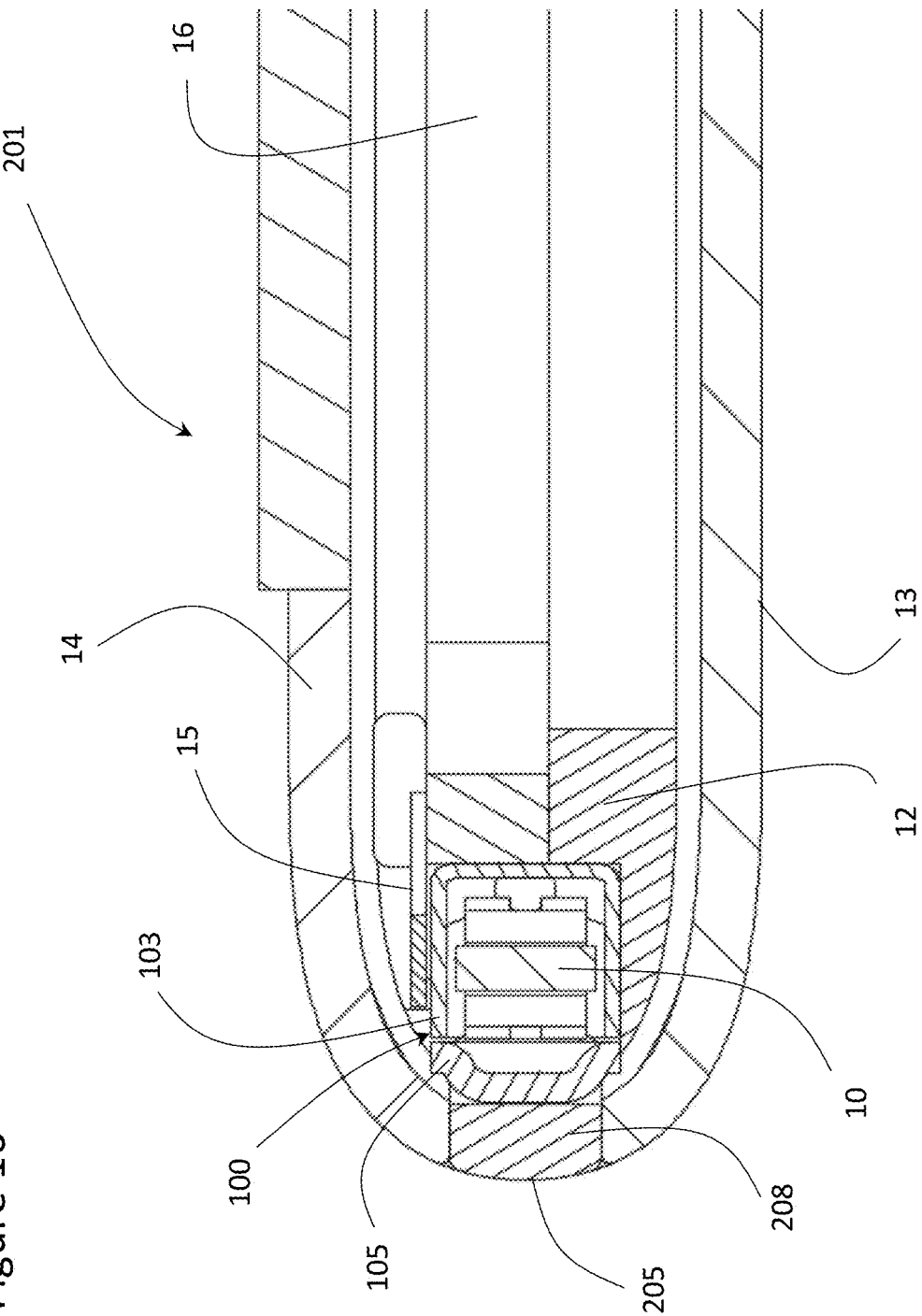
FIG. 16 is a partially sectioned side view of the device of FIG. 15.
Figure 17:
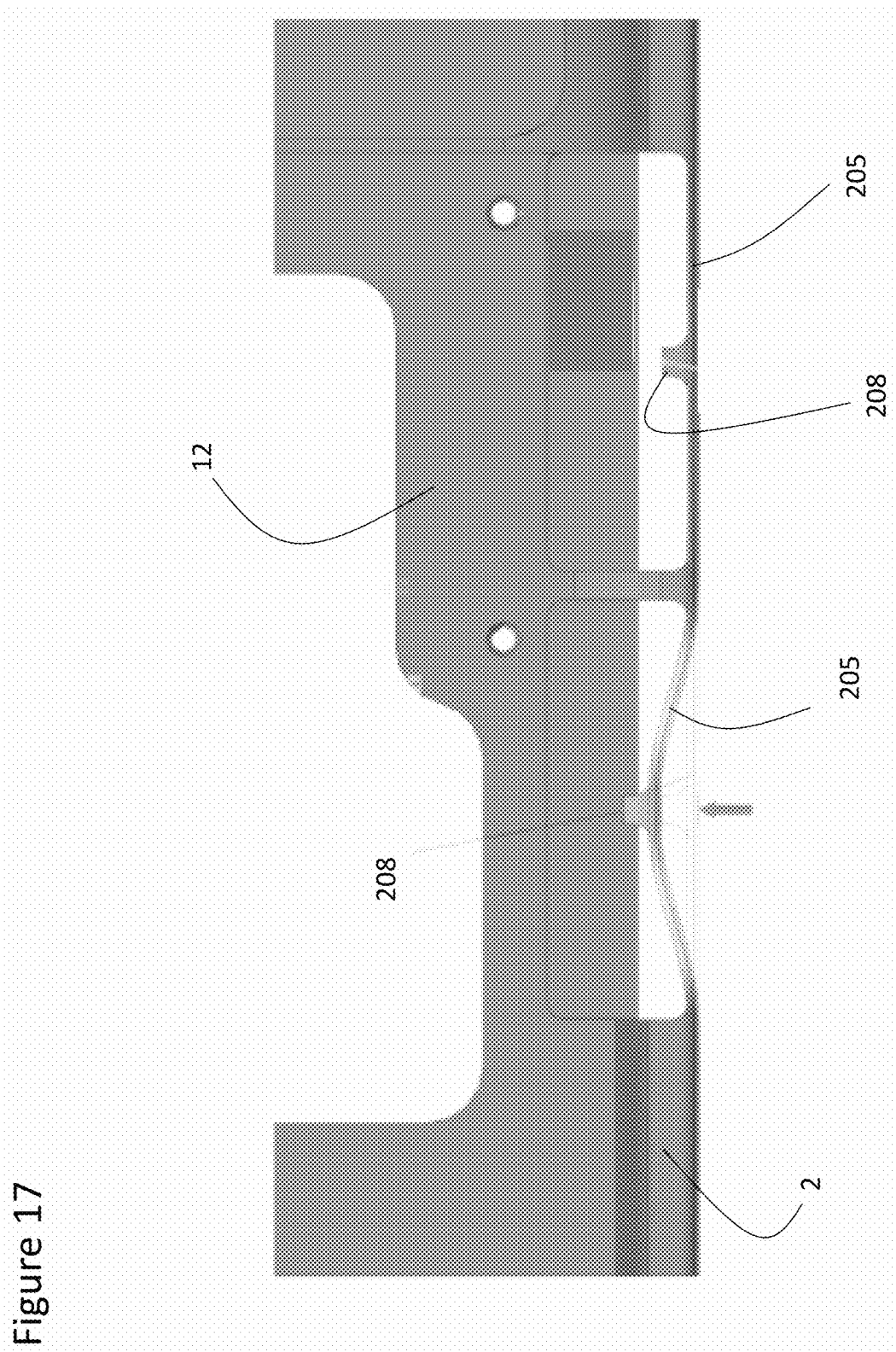
FIG. 17 is a top view of the device of FIG. 15.

With reference to FIGS. 15 to 17, a pair of encapsulated piezo-electric actuators 10 are disposed in the mobile device 1, including the outer frame 2 and virtual buttons 205. Each piezo-electric actuator 10 is encapsulated in one of the housings 100, and may be positioned between the inner frame 12 or the PCB 16 and the outer frame 2 in one or separate cavities 9 or within the cavities 9 in the outer frame 2. The virtual buttons 205 are formed by thinning the outer frame 2 to a thickness, such as 0.25 mm to 0.75 mm, e.g. ⅛ to 1/20 the original thickness of 3 mm-4 mm, that enables a minor deflection, see FIG. 17, e.g. 0.02 mm to 0.5 mm at a 5N force, and a sidewall rigidity of 10 N/mm to 250 N/mm, preferably 0.07 mm to 0.5 mm deflection for 10 N/mm to 70 N/mm rigidity. Living hinges 204 are formed at the edges of the virtual buttons 205, where the virtual buttons 205 meet the thicker outer frame 2. The thinned section of the virtual buttons 205 may include a pedestal 208 which extends from the outer wall of the outer frame 2 into contact with the piezo-electric actuator 10, and in particular to the pusher plate 105, and even more specifically to the bump 109 on the pusher plate 105 for activating the piezo-electric actuator 10 and receiving haptic feedback therefrom.

Figure 18:
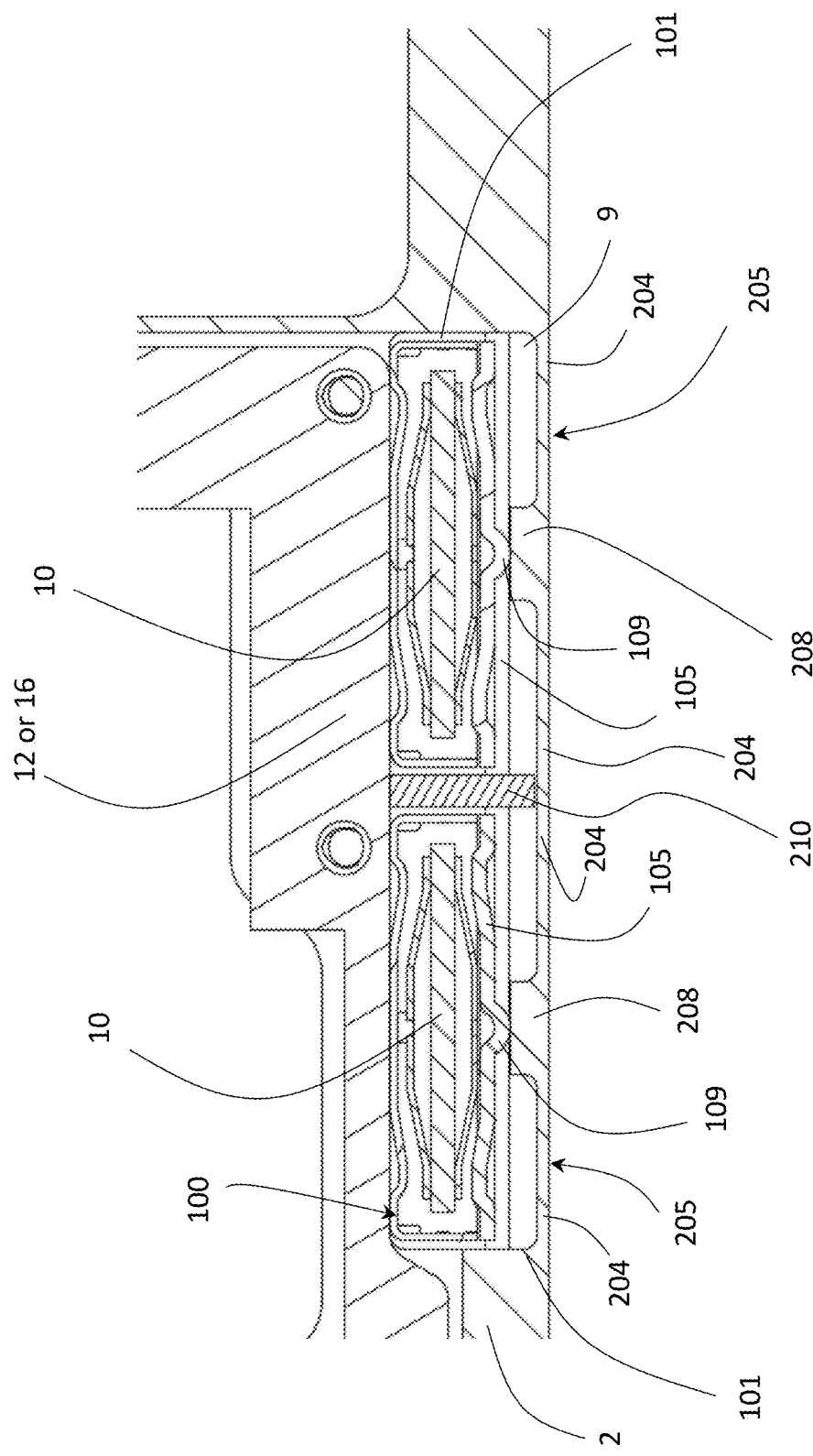
FIG. 18 is a partially sectioned top view in accordance with another example of a mechanical integration of a piezo-electric actuator in the side of a mobile device of the present disclosure.

With reference to FIG. 18, a pair of encapsulated piezo-electric actuators 10 are disposed in the smart device 201, including the outer frame 2 and the virtual buttons 205. Each piezo-electric actuator 10 may be encapsulated in one of the housings 100, and may be positioned between the inner frame 12 or the PCB 16 and the outer frame 2 in a single cavity 9 or within a single cavity 9 in the outer frame 2. The plurality of virtual buttons 205 may be constructed of a single thinned section of the outer frame 2. A pivot structure 210 extending from the inner frame 12 or the PCB 16 may be positioned in the cavity 9 between the encapsulated piezo-electric actuators 10 to provide a pivot point and a hard stop for the individual virtual buttons 205 on either side thereof. The virtual buttons 205 are formed by thinning the outer frame 2 to a thickness such as 0.25 mm to 0.75 mm, e.g. ⅛ to 1/20 the original thickness of 3 mm to 4 mm, that enables a minor deflection, e.g. 0.02 mm to 0.5 mm at a 5N force a sidewall rigidity of 10 N/mm to 250 N/mm, preferably 0.07 mm to 0.5 mm deflection for 10 N/mm to 70 N/mm rigidity. The thinned section of the virtual buttons 205 may include a pedestal 208 which extends from the outer wall of the outer frame 2 into contact with the piezo-electric actuator 10, and in particular to the pusher plate 105, and even more specifically to the bump 109 on the pusher plate 105 for activating the piezo-electric actuator 10 and receiving haptic feedback therefrom.

Figure 19:
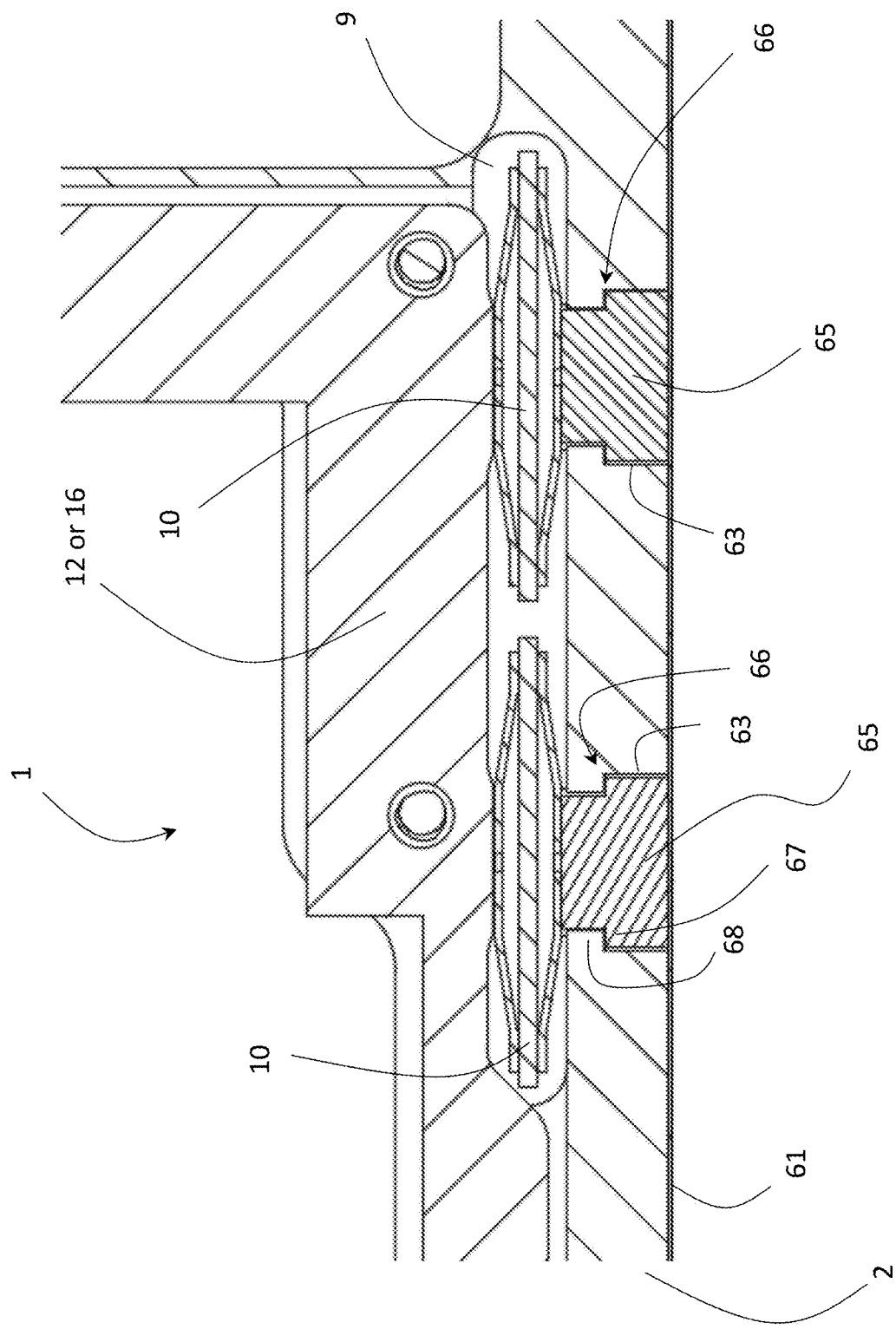
FIG. 19 is a partially sectioned top view in accordance with another example of a mechanical integration of a piezo-electric actuator in the side of a mobile device of the present disclosure.
Figure 20:
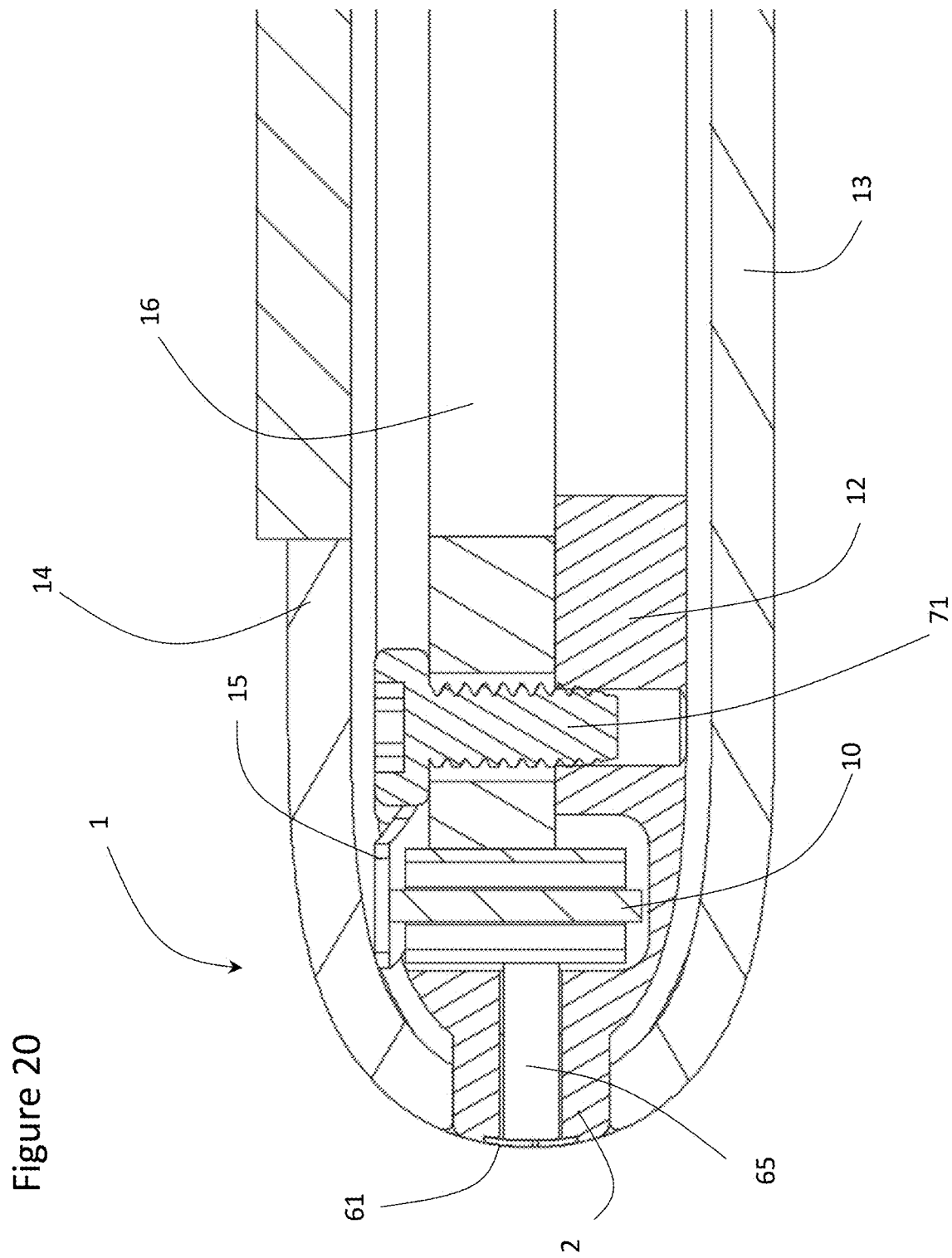
FIG. 20 is a partially sectioned side view of the device of FIG. 19.

Another example of an integrated mechanical button for the mobile device 1 is illustrated in FIGS. 19 and 20, and includes a thin membrane, e.g. plastic or glass, fascia 61 that covers virtual buttons 65 in the form of push blocks, which extend through holes 63 in the outer frame 2 into contact with the piezo-electric actuators 10. The virtual buttons 65, e.g. the push blocks, may be comprised of a light transparent material, and used as a light pipe to transmit light from an internal light source to the glass fascia 61 to illuminate the functionality of the virtual buttons 65, when the thin glass of the fascia 61 is used as a stencil in conjunction therewith. The virtual buttons 65, e.g. the push blocks, may also include hard stops 66 to limit the amount of force transmitted to the piezo-electric actuators 10. The hard stops 66 may be in the form of a first abutting surface 67, e.g. a shoulder, on the virtual buttons 65, e.g. the push block, and a second abutting surface 68, e.g. a ledge, on the outer frame 62 with a gap therebetween. Accordingly, the virtual button 65 may only be pushed the distance of the gap, after which the first abutting surface 67 contacts the second abutting surface 68, thereby transferring any additional force to the outer frame 62 and preventing any further force from damaging the piezo-electric actuators 10.

Another feature of the example in FIGS. 19 and 20, was to use existing components, such as the PCB 16, in a manner that would allow the adjustment of a preload made to the piezo-electric actuators 10 to compensate for the large tolerance of their length. For example, one or more of the piezo-electric actuators 10 may be mounted in the cavity 9, and the PCB 16 may be positioned against an inner side of the piezo-electric actuators 10 providing a pre-loading force thereon. The PCB 16 may then be fixed to the inner frame 12 with an adhesive or a mechanical fastener 71, e.g. screw or bolt, providing a permanent pre-load to each of the piezo-electric actuators 10.

Figure 21:
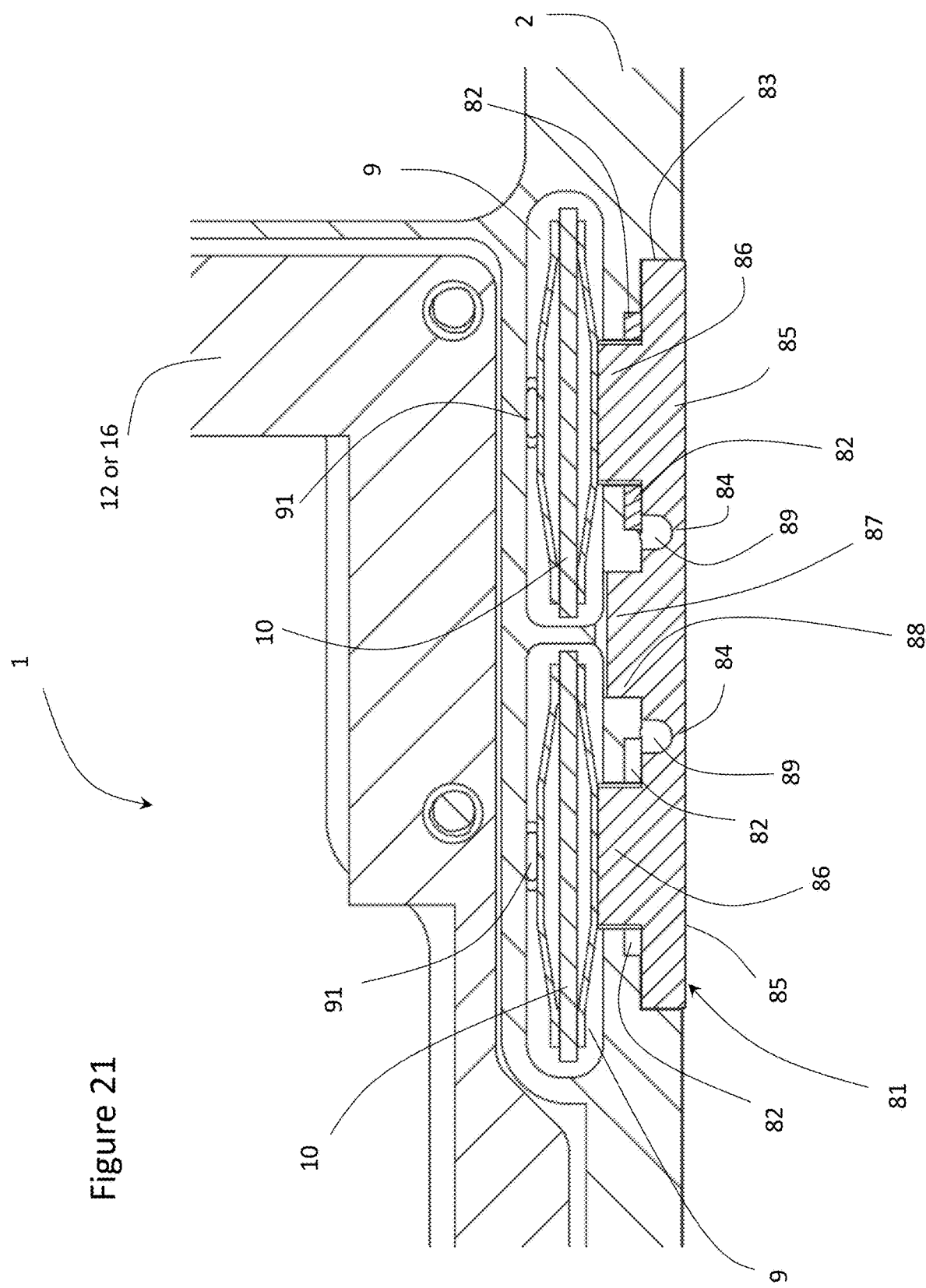
FIG. 21 is a partially sectioned top view in accordance with another example of a mechanical integration of a piezo-electric actuator in the side of a mobile device of the present disclosure.
Figure 22:
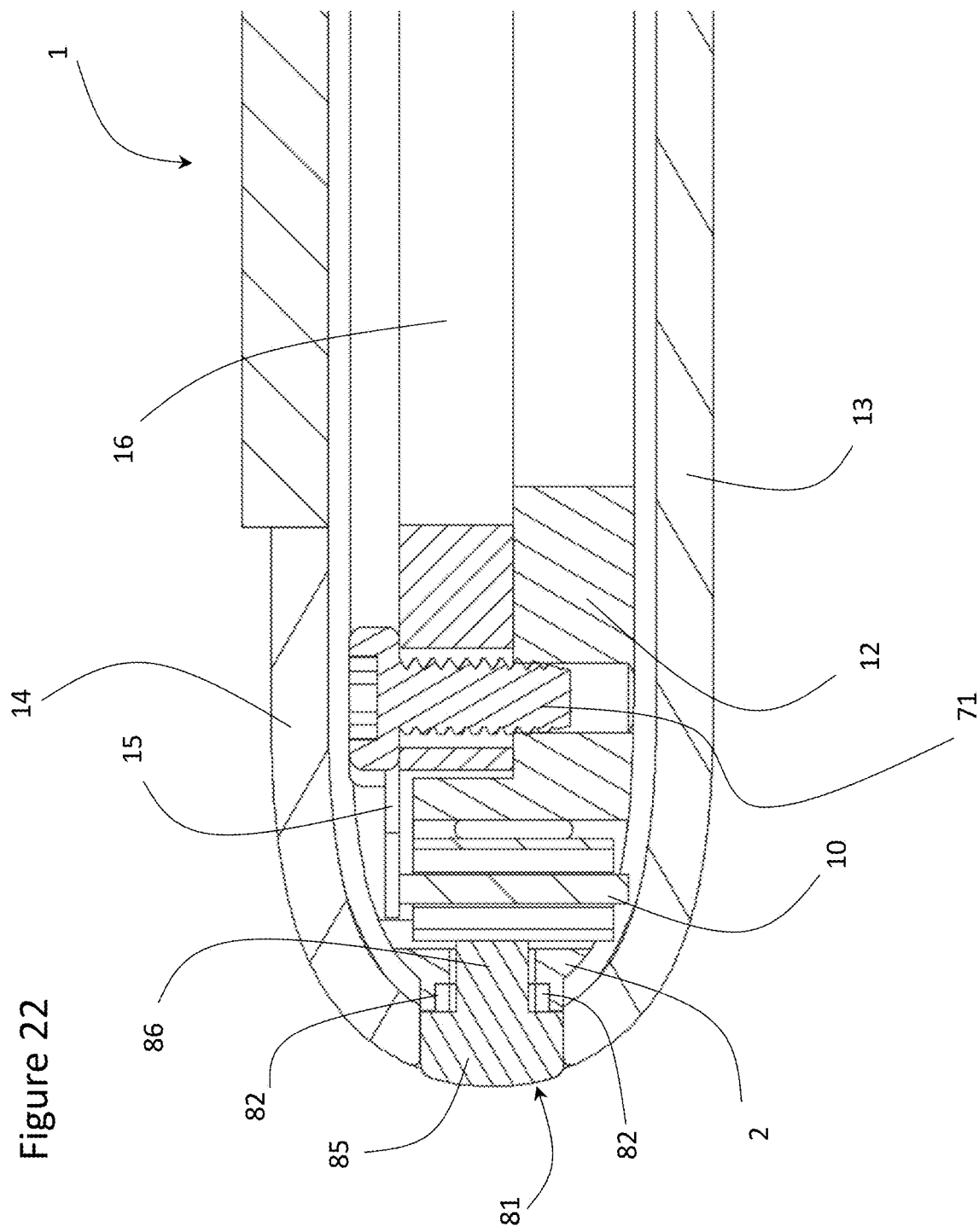
FIG. 22 is a partially sectioned side view of the device of FIG. 21.
Figure 23:
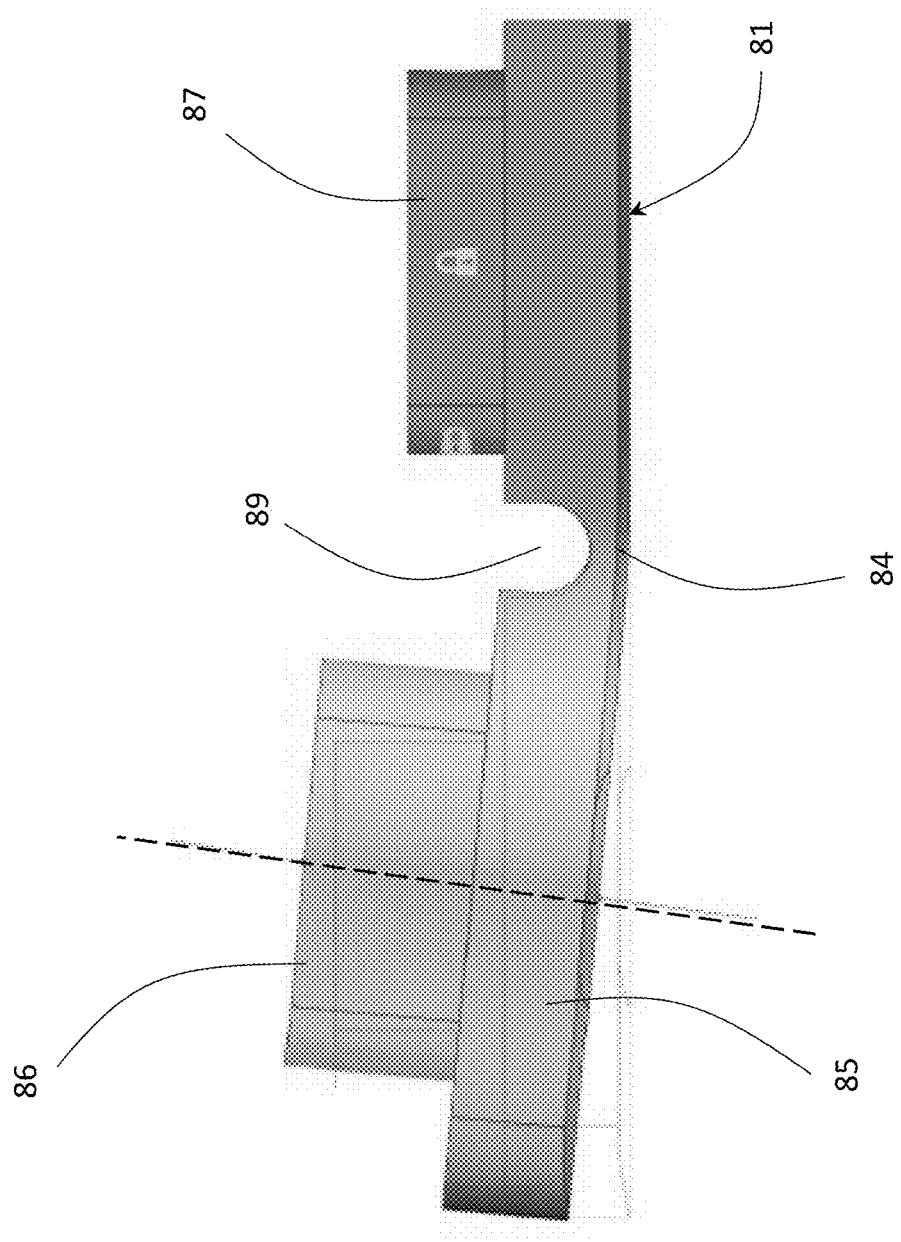
FIG. 23 is a top view of the button structure of the device of FIG. 21.

Another example of the mobile device 1 is illustrated in FIGS. 21-23, and includes a button structure 81 that would move in relationship to the outer frame 2 of the smart device 1, but unlike a traditional mechanical button, the displacement would be very small, and a multitude of haptic feedback could be created. The ingress protection challenge would be insured by seals 82 between the button structure 81 and the outer frame 2. Special attention could be taken to minimize the appearance of any gap between the button structure 81 and the outer frame 2.

The button structure 81 may comprise a plurality of interconnected virtual buttons 85 extending through holes 83 in the outer frame 2 into contact with a respective one of a plurality of piezo-electric actuators 10, mounted inside respective cavities 9 or a single cavity 9 in or adjacent to the outer frame 2. The button structure 81 may include one or more extensions 86 extending through the holes 83 into contact with respective piezo-electric actuators 10, and one or more projections 87 (tenon) extending into the outer frame 2 in between adjacent extensions 86, for fitting, e.g. frictionally, into a complementary groove 88 (mortise) provided in the outer frame 2 for increasing the bonding area of the button structure 81 to the outer frame 2. The projection 87 and the groove 88 may extend partially through the outer frame or the projection 87 and the groove 88 may extend all the way through the outer frame 2.

With particular reference to FIG. 23, one or both sides of each projection 87 may provide a pivot points or a hinge 84 for the virtual buttons 85. The hinges 84 between the projection 87 and the extensions 86 may be made by providing a relatively thinned section between each extension 86 and the projection 87, which is thinner than the rest of the button structure 81, forming troughs 89 which may be filled with elastic material, providing living hinges to facilitate movement/rotation of the virtual buttons 85.

The button structure 81 may also include a first abutting surface comprising shoulders on either side of the extensions 86 and/or projections 87 for abutting a second abutting surface formed by ledges in the outer frame 2 on either side of the stepped openings that receive the extensions 86 and the projection 87. Accordingly, the virtual button 5 may only be pushed the distance of a gap between the first abutting surface and the second abutting surface, after which the first abutting surface contacts the second abutting surface, thereby transferring any additional force to the outer frame 2 and preventing any further force from damaging the piezo-electric actuators 10. The seals 82 may be disposed in the first abutting surface and/or the second abutting surface, e.g. in the shoulders of the extensions 86 and/or the projections 87 and in the ledges in the outer frame 2.

Gap filling adhesive 91 may be provided between the piezo-electric actuators 10 and the outer frame 2 and/or the inner frame 12 to compensate for loose tolerances of the piezo-electric actuators 10.

Figure 24:
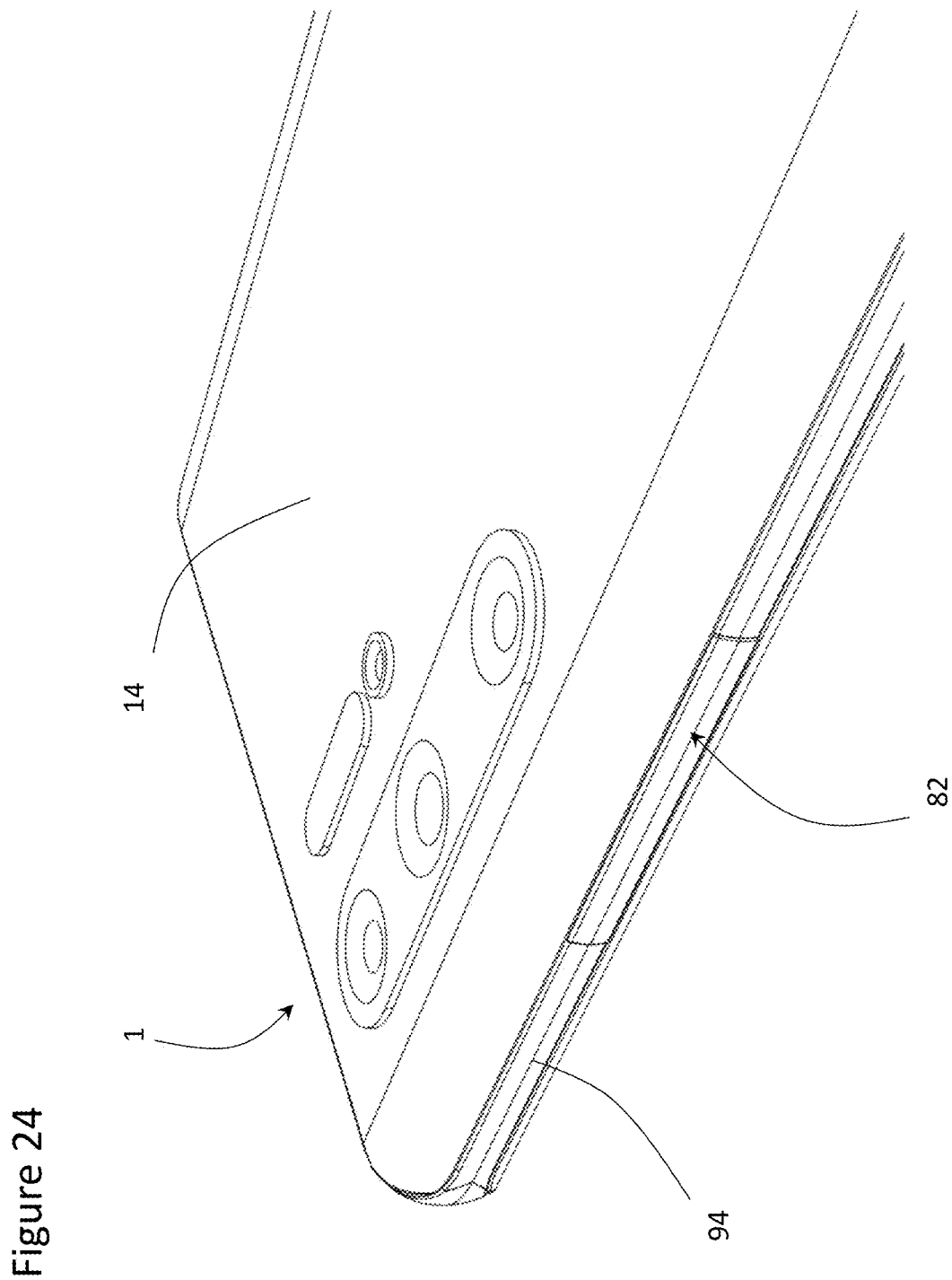
FIG. 24 is an isometric view of the device of FIG. 21.

FIG. 24 illustrates a variant of this concept in which the button structure 81 shares the same gap as the back cover 14 and the front display 13, i.e. the buttons 85 are the same thickness as the outer frame 2, leaving only two small vertical gaps between the button structure 81 and the outer frame 2, which could also be filled by an elastic material, as hereinbefore described.

Figure 25:
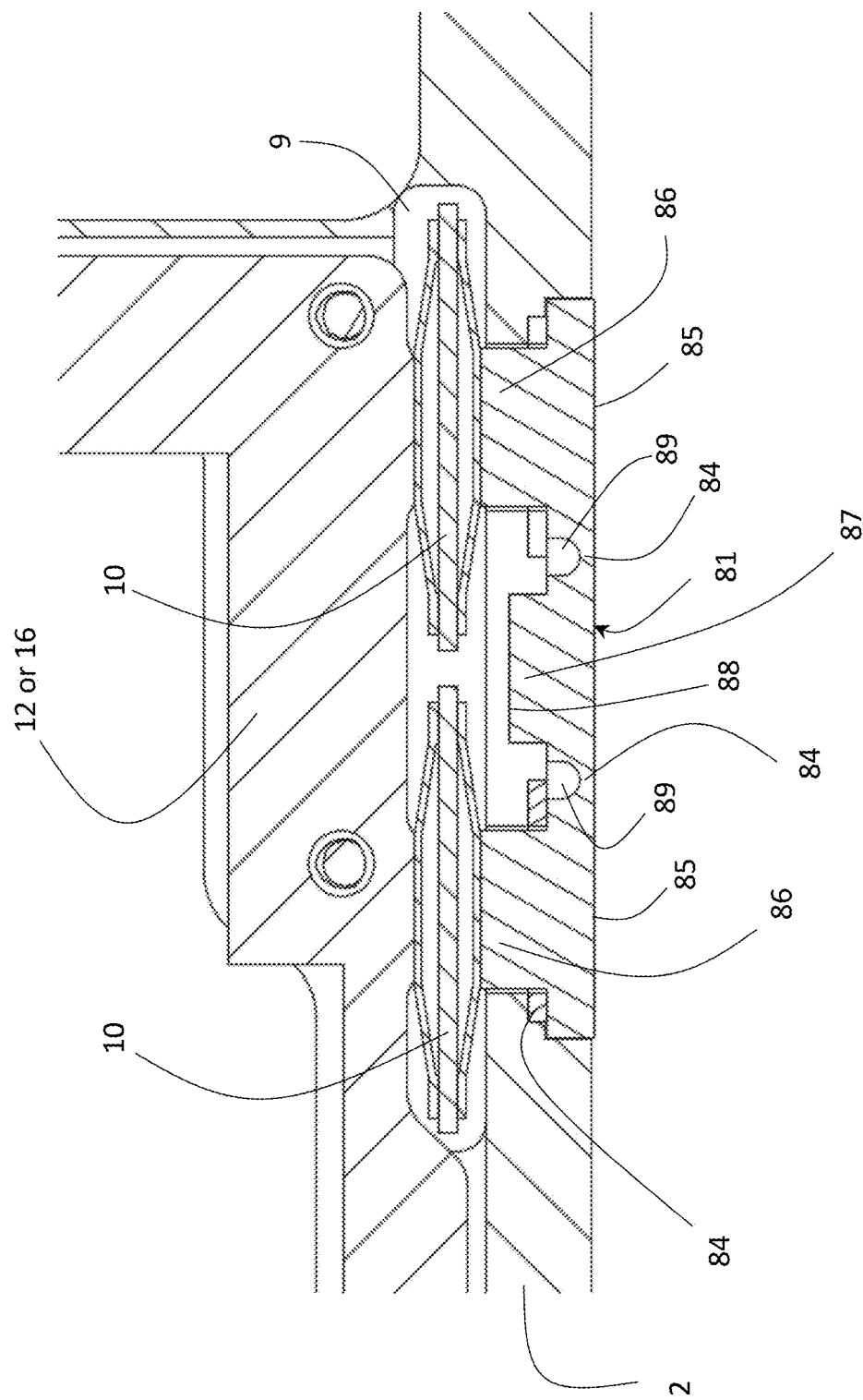
FIG. 25 is a partially sectioned top view in accordance with another example of a mechanical integration of a piezo-electric actuator in the side of a mobile device of the present disclosure.
Figure 26:
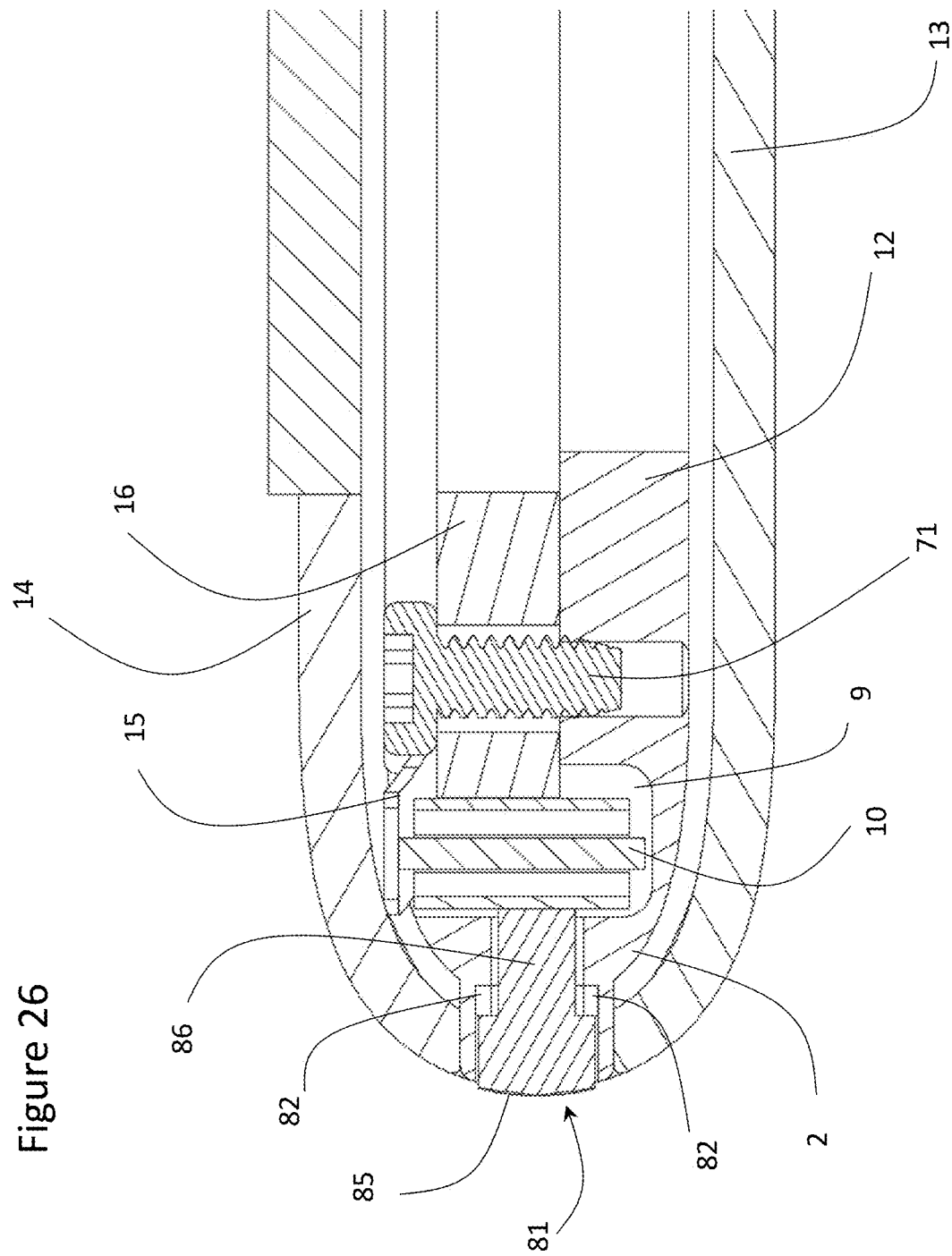
FIG. 26 is a partially sectioned side view of the device of FIG. 25.
Figure 27:
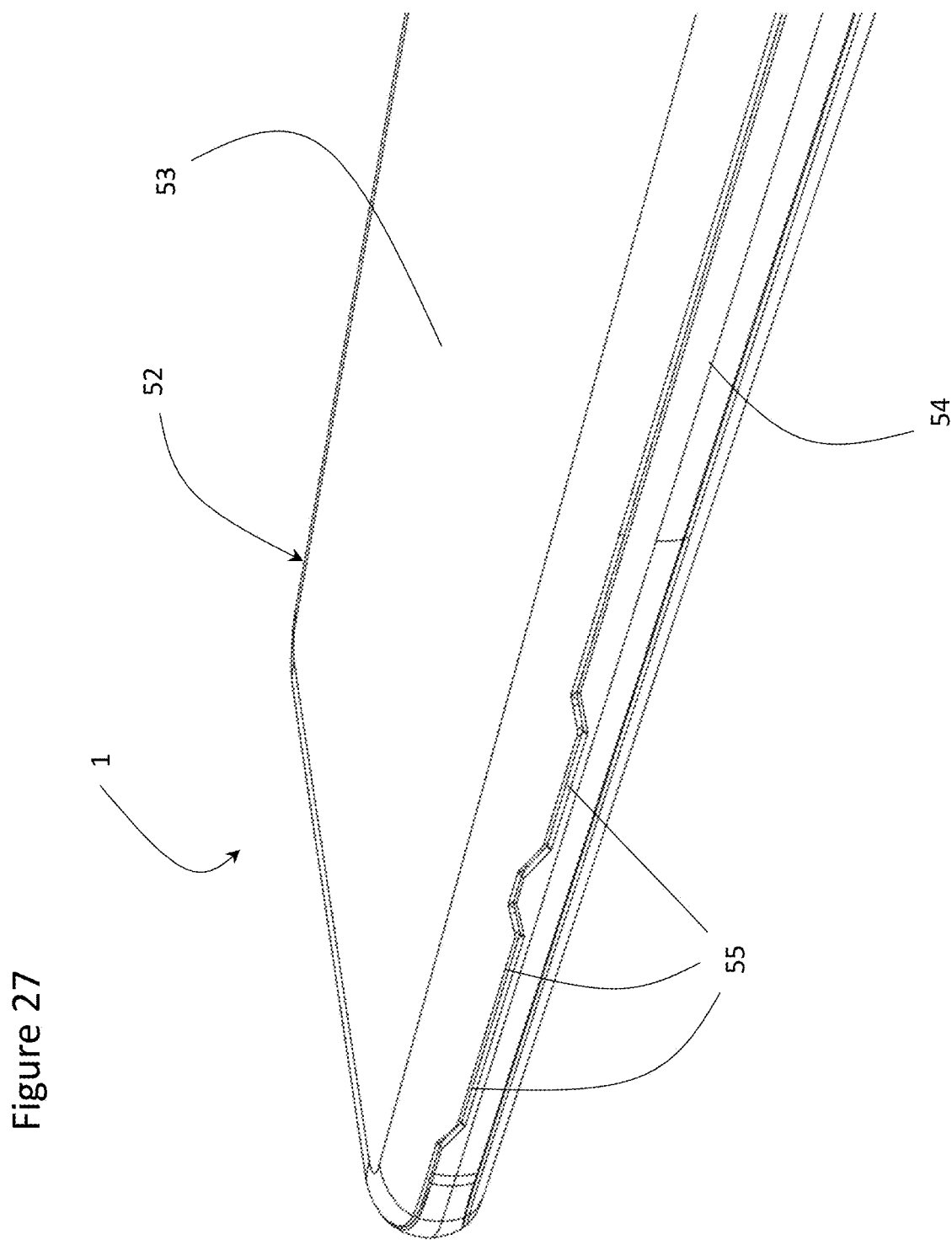
FIG. 27 is an isometric view in accordance with another example of a mechanical integration of a piezo-electric actuator in the side of a mobile device of the present disclosure.
Figure 28:
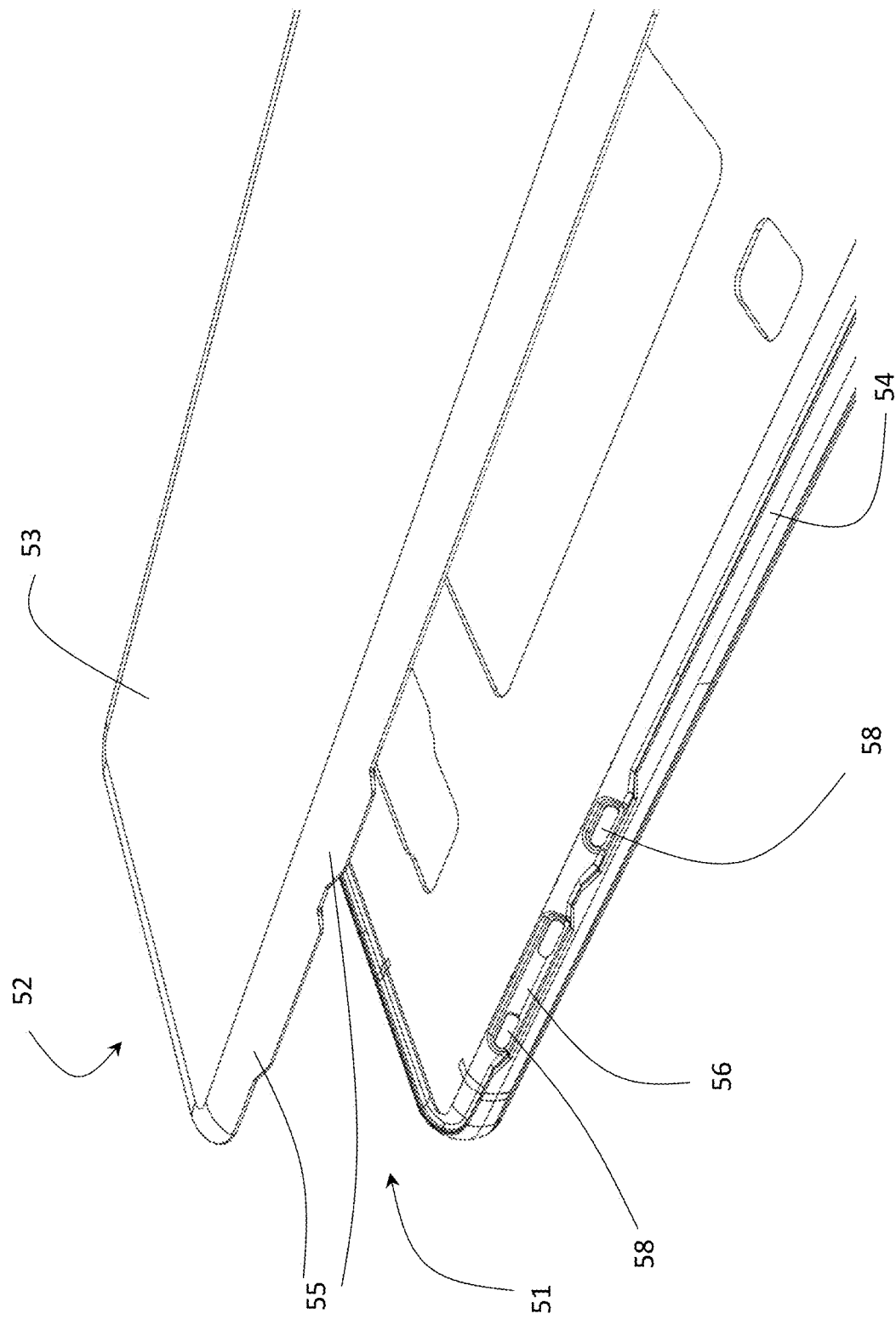
FIG. 28 is an exploded view of the device of FIG. 27.
Figure 29:
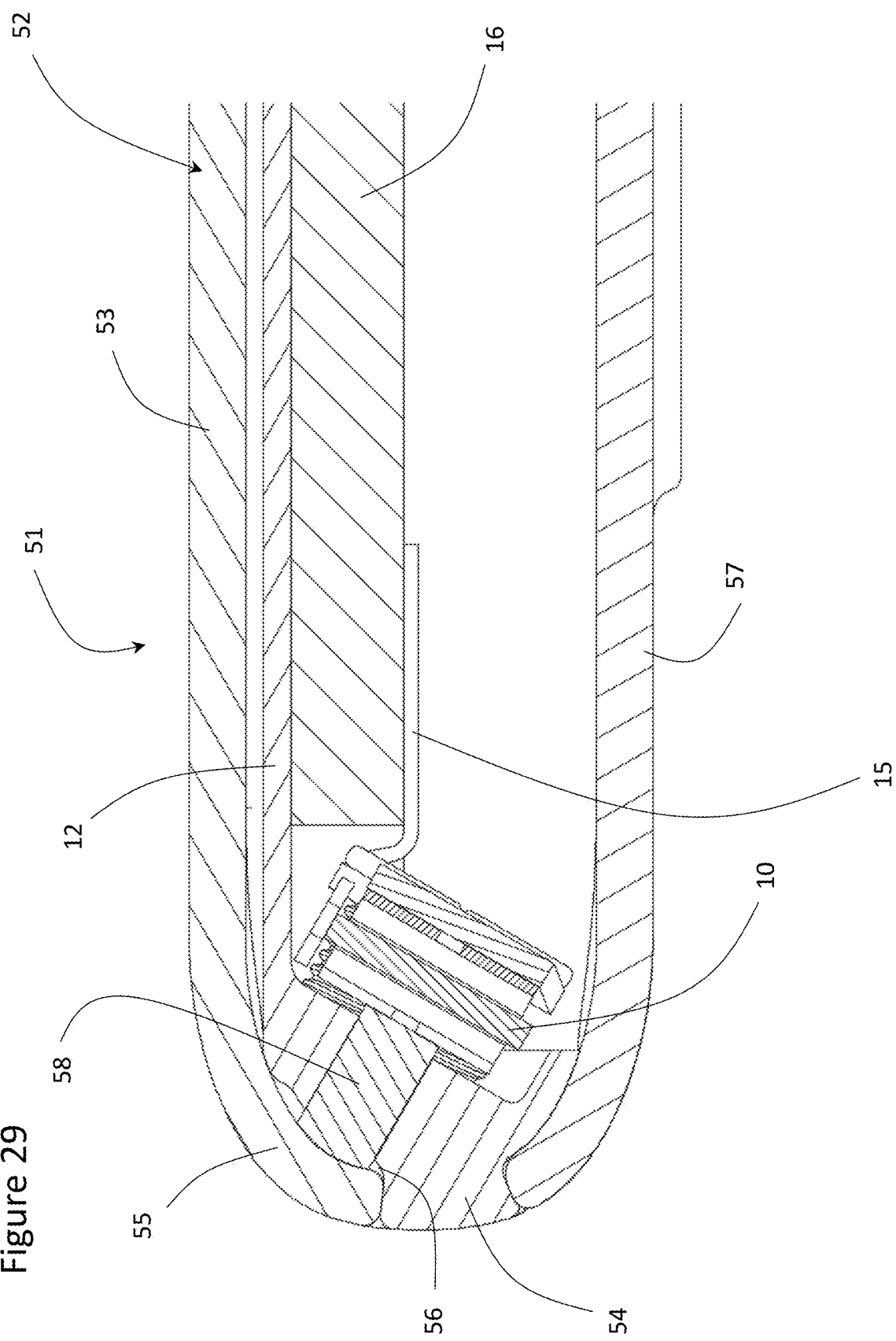
FIG. 29 is a side view of the device of FIG. 27.

In an alternate example, illustrated in FIGS. 25 and 26, all the other elements may be the same, but each cavity 9 may be formed between the outer frame 2 and the inner frame 12 or the PCB 16, and may be comprised of a single opening or cavity 9 for a plurality of piezo-electric actuators 10. Accordingly, the inner side of the piezo-electric actuators 10 are mounted against the inner frame 12 or the PCB 16, while the outer side of the piezo-electric actuators 10 are in contact with the extensions 86. In some embodiments, the projections 87 may not extend the entire width through the outer frame 2, i.e. extend only partially through the outer frame 2, thereby minimizing the points of ingress into the mobile device 1. Accordingly, the groove 88 in the outer frame 2 only extends partially into the outer frame.

In some embodiment, the button structure 81 may have a different thickness than the outer frame 2, namely the button structure 81 may be thinner than the thickness of the outer frame 2, whereby the virtual buttons 85 fit in the outer frame 2 and are totally surrounded by the outer frame 2 creating additional gaps that need to be sealed, as above.

Another embodiment of the mobile device 1 includes a display 52, e.g. transparent material, such as glass or plexiglass, that may be flexible enough to transmit the haptic feedback generated by the piezo-electric actuator 10. The example of FIGS. 27-31 includes the display 52, which includes elongated curved sections extending from a side of a flat main display section 53 around at least a portion of a side of the outer frame 2, up to the entire side of the outer frame 2, forming one or more different individual curved tabs representing virtual buttons 55. Located under the virtual buttons 55, the piezo-electric actuators 10 are separated by a small gap 56 between the display 52, i.e. the virtual buttons 55, and the outer frame 2 to allow for a small displacement of the virtual buttons 55, enough for the piezo-electric actuator 10 to sense the input from the user and the piezo-electric actuator 10 to transmit the haptic feedback back to the user. However, a hard stop is formed by the edge of the virtual buttons 55, i.e. a first abutting surface, contacting the outer frame 2, i.e. a second abutting surface, as soon as the gap 56 is traversed by the virtual buttons 55 to protect the piezo-electric actuators 10. Accordingly, the virtual buttons 55 may only be pushed the distance of the gap 56 between the first abutting surface and the second abutting surface, after which the first abutting surface contacts the second abutting surface, thereby transferring any additional force to the outer frame 2 and preventing any further force from damaging the piezo-electric actuators 10. In this case, the sensing could also be captured by the display 52, when the display 52 comprises a touch-sensitive display. A force transmitting push block 58 comprising a rigid material, e.g. plastic, may be provided between the virtual buttons 55 and the piezo-electric actuator 10 to transmit the forces therebetween.

Figure 30:
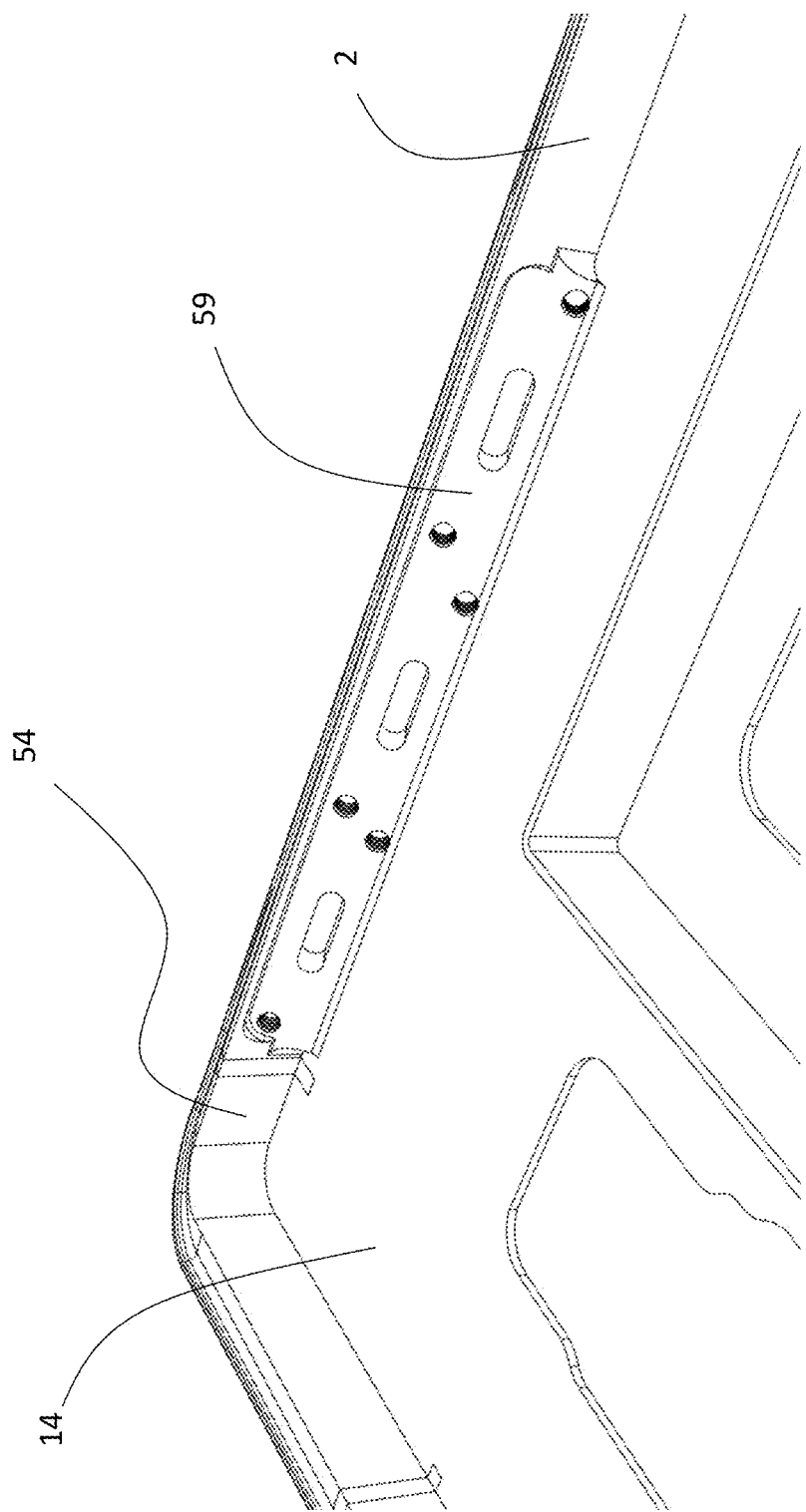
FIG. 30 is an isometric view of the outer frame of the device of FIG. 27.
Figure 31:
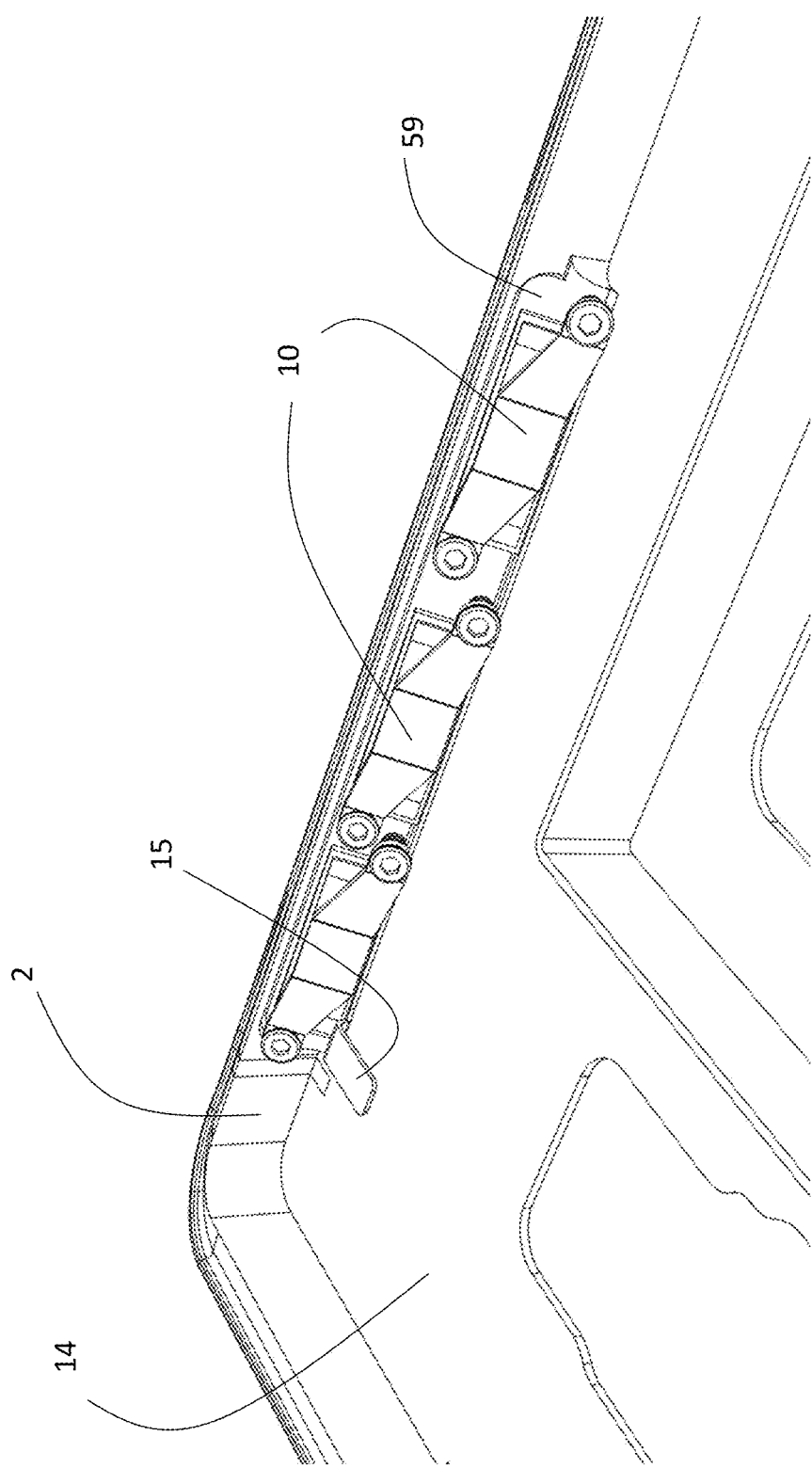
FIG. 31 is an isometric view of the outer frame of the device of FIG. 27 with the piezo-electric actuators installed.

With reference to FIGS. 30 and 31, the piezo-electric actuators 10 may be mounted on the outer frame 2 at an acute angle to the vertical side wall, e.g. about 15°-75°, preferably about 20° to 45°, and to the display 52 and the back cover 14 via an angled support 59. At least one flex PCB connector 15 may be used to connect the piezo-electric actuators 10 to a controller on the PCB 16 of the mobile device 1 for exchanging an actuator voltage signal to the controller and a haptic voltage signal to the piezo-electric actuator 10 to provide the haptic feedback to the user.

The term controller or processor may include a computer processor including computer hardware and computer software executable thereon along with suitable memory for storing the computer software. The term circuit may include dedicated hardware or hardware in associated with software executable thereon.

As used in this application, the term "circuitry" may refer to one or more or all of the following:
(a) hardware-only circuit implementations (such as implementations in only analog and/or digital circuitry);
(b) combinations of hardware circuits and software, such as (as applicable):
  (i) a combination of analog and/or digital hardware circuit(s) with software/firmware and
  (ii) any portions of hardware processor(s) with software (including digital signal processor(s)), software, and memory(ies) that work together to cause an apparatus, such as a mobile phone or server, to perform various functions); and
(c) hardware circuit(s) and or processor(s), such as a microprocessor(s) or a portion of a microprocessor(s), that requires software (e.g., firmware) for operation, but the software may not be present when it is not needed for operation."

This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

The foregoing description of one or more example embodiments has been presented for the purposes of illustration and description. It is not intended to be exhaustive or to limit the invention to the precise form disclosed. Many modifications and variations are possible in light of the above teaching. It is intended that the scope of the disclosure be limited not by this detailed description.

I claim:

1. A mobile device comprising:
an outer frame;
a switch comprising:
  a first piezo-electric actuator configured to generate a first actuator voltage signal in response to a first force applied thereto by a user, and to generate a first haptic feedback to the user in response to a first haptic voltage signal transmitted from a controller thereto; and
  a first virtual button at a side of the mobile device in the outer frame configured to transmit the first force from the user to the first piezo-electric actuator, and to transmit the first haptic feedback from the first piezo-electric actuator to the user;
wherein the first virtual button includes:
  a push button extending through a first hole in the outer frame for actuating the first piezo-electric actuator when the push button is pushed; and
  a first abutting surface comprising a shoulder on the push button; and
wherein the outer frame includes a second abutting surface formed by a ledge in the outer frame on a side of the first hole configured with a gap between the first abutting surface and the second abutting surface;
whereby when the first force is applied to the push button, the push button only moves a distance of the gap, after which the first abutting surface contacts the second abutting surface, thereby transferring additional force to the outer frame preventing damage to the first piezo-electric actuator.

2. The mobile device according to claim 1, further comprising a thin membrane fascia covering the first virtual button.

3. The mobile device according to claim 2, wherein the thin membrane fascia comprises plastic.

4. The mobile device according to claim 2, wherein the thin membrane fascia comprises glass.

5. The mobile device according to claim 2, wherein the first virtual button comprises a light transparent material configured as a light pipe to transmit light from an internal light source to the thin membrane fascia.

6. The mobile device according to claim 1, wherein the first virtual button comprises of a light transparent material configured as a light pipe to transmit light from an internal light source to illuminate the first virtual button.

7. The mobile device according to claim 1, further comprising a PCB including the controller;
wherein the PCB is fixed to the outer frame, and mounted against the first piezo-electric actuator,
whereby the PCB is configured to apply a preload force to the first piezo-electric actuator.

8. The mobile device according to claim 7, further comprising at least one flex PCB connector configured to connect the first piezo-electric actuator to the controller.

9. The mobile device according to claim 1, further comprising seals disposed in the first abutting surface and/or the second abutting surface.

10. The mobile device according to claim 1, wherein the first virtual button includes:
a projection extending into a complementary groove provided in the outer frame; and
a first living hinge comprising a first thinned section between the projection and the push button.

11. The mobile device according to claim 10, further comprising:
a second piezo-electric actuator configured to generate a second actuator voltage signal in response to a second force applied thereto by the user, and to generate a second haptic feedback to the user in response to a second haptic voltage signal transmitted from the controller thereto; and
a second virtual button in the outer frame configured to transmit the second force from the user to the second piezo-electric actuator, and to transmit the second haptic feedback from the second piezo-electric actuator to the user;
wherein the second virtual button comprises:
a second push button extending though a second hole in the outer frame into contact with the second piezo-electric actuator; and
a second living hinge comprising a second thinned section between the second push button and the projection.

12. The mobile device according to claim 10, wherein the projection frictionally fits into the complementary groove.

13. The mobile device according to claim 10, wherein the first thinned section forms a trough filled with elastic material.

14. The mobile device according to claim 10, wherein the first piezo-electric actuator is mounted in a cavity in the outer frame; and further comprising an adhesive between the first piezo-electric actuator and the outer frame configured to compensate for loose tolerances of the first piezo-electric actuator.

15. The mobile device according to claim 10, wherein the projection extends an entire width through the outer frame.

16. The mobile device according to claim 10, wherein the complementary groove only extends partially into the outer frame; and
wherein the projection extends only partially through the outer frame, thereby minimizing points of ingress into the mobile device.

17. The mobile device according to claim 1, further comprising:
a display mounted on one side of the outer frame; and
a back cover mounted on an opposite side of the outer frame;
wherein the first virtual button extends between the display and the back cover.

18. The mobile device according to claim 17, wherein the first virtual button has a same thickness as the outer frame.

19. The mobile device according to claim 1, further comprising an inner frame;
wherein the first piezo-electric actuator is mounted against the inner frame.

20. The mobile device according to claim 1, further comprising a PCB including the controller; wherein the first piezo-electric actuator is mounted against the PCB.

* * * * *